(12) United States Patent
Ohsawa et al.

(10) Patent No.: US 9,240,365 B2
(45) Date of Patent: Jan. 19, 2016

(54) COOLING DEVICE AND ELECTRONIC DEVICE

(75) Inventors: Kenji Ohsawa, Kagoshima (JP);
Katsuya Tsuruta, Kagoshima (JP)

(73) Assignee: Molex, LLC, Lisle, IL (US)

( * ) Notice: Subject to any disclaimer, the term of this patent is extended or adjusted under 35 U.S.C. 154(b) by 119 days.

(21) Appl. No.: 13/255,964

(22) PCT Filed: Mar. 12, 2010

(86) PCT No.: PCT/US2010/027081
§ 371 (c)(1),
(2), (4) Date: Sep. 12, 2011

(87) PCT Pub. No.: WO2010/105125
PCT Pub. Date: Sep. 16, 2010

(65) Prior Publication Data
US 2012/0002370 A1    Jan. 5, 2012

(30) Foreign Application Priority Data

Mar. 12, 2009  (JP) .................................. 2009-59911

(51) Int. Cl.
| F25B 41/06 | (2006.01) |
| H01L 23/427 | (2006.01) |
| F28D 15/02 | (2006.01) |
| F28D 15/04 | (2006.01) |

(52) U.S. Cl.
CPC .......... *H01L 23/427* (2013.01); *F28D 15/0233* (2013.01); *F28D 15/0266* (2013.01); *F28D 15/046* (2013.01); *H01L 2924/0002* (2013.01)

(58) Field of Classification Search
CPC ............ F25D 15/0233; F25D 15/0266; F25D 15/046; H01L 23/427

USPC .............. 62/3.2, 3.3, 119, 259.2; 165/104.33, 165/104.34, 104.21, 80.4, 104.26, 185–187
See application file for complete search history.

(56) References Cited

U.S. PATENT DOCUMENTS

| 6,889,756 B1 * | 5/2005 | Hou .......................... 165/104.33 |
| 6,957,692 B1 * | 10/2005 | Win-Haw et al. ......... 165/104.33 |
| 7,011,146 B2 * | 3/2006 | Wong ........................ 165/104.33 |
| 2005/0083655 A1 | 4/2005 | Jairazbhoy et al. |
| 2005/0173096 A1 * | 8/2005 | Hsu et al. .................. 165/104.21 |
| 2006/0090882 A1 | 5/2006 | Sauciuc |
| 2009/0140417 A1 * | 6/2009 | Refai-Ahmed ............... 257/707 |

FOREIGN PATENT DOCUMENTS

| EP | 1 610 607 A1 | 12/2005 |
| JP | 2004-037001 | 2/2004 |

OTHER PUBLICATIONS

International Search Report for PCT/US2010/027081.

* cited by examiner

*Primary Examiner* — Jonathan Bradford
*Assistant Examiner* — Elizabeth Martin
(74) *Attorney, Agent, or Firm* — James A. O'Malley

(57) ABSTRACT

A cooling device is disclosed. The cooling device includes a thermal diffusing unit operable to radiate heat taken from a heating element, and a heat transporting part, laminated in a thickness direction of the heat diffusing unit and diffused thereby. The thermal diffusing unit has an upper plate, a lower plate opposite thereto, a vapor diffusion path to diffuse an evaporated refrigerant, and a capillary channel to circulate a condensed refrigerant. The heat transporting part has an upper plate, a lower plate opposite thereto, a vapor diffusion path to diffuse an evaporated refrigerant, and a capillary channel to circulate a condensed refrigerant. Either the upper plate or the lower plate is formed with the same member of the lower plate or the upper plate of the heat transporting part.

18 Claims, 12 Drawing Sheets

COOLING DEVICE AND ELECTRONIC DEVICE

REFERENCE TO RELATED APPLICATIONS

The Present Application claims priority to prior-filed Japanese Patent Application No. 2009-059911, entitled "Cooling Device And Electronic Device," and filed 12 Mar. 2009, the contents of which is fully incorporated in its entirety herein.

BACKGROUND OF THE PRESENT APPLICATION

The Present Application relates, generally, to both a cooling device and an electronic device for unifying the function of efficiently refrigerating heat received from a heating element of an electronic device.

Electronic parts, used in electronic devices, for example, are heating elements that generate heat according to the current flows within. When the heating element is operable, and the temperature thereof hits a constant temperature, the efficient operation of the device diminishes, causing the performance of the electronic device to deteriorate.

In order to cool a heating element, the cooling device utilizing a heat pipe possessing the cooling effect according to the vaporization and condensation of a entered refrigerant is proposed. When the refrigerant evaporates, the heat pipe takes heat from the heating element. The evaporated refrigerant is refrigerated and condensed by radiating heat. The condensed refrigerant circulates again. By repetition of the vaporization and condensation, the heat pipe refrigerates the heating element.

The heating element mounted on an electronic device or industrial equipment is provided in the electronic device or the industrial equipment. The heat from the heating element is necessary to be radiated to the part which is isolated from the heating element.

The cooling device possesses: a thermal diffusion function of taking and then diffusing the heat of the heating element; a heat transporting function of transporting the diffused heat to the part operable to radiate the heat; and a heat radiating function of radiating the transported heat. The cooling device comprises the structure for realizing the three functions, and refrigerates the heating element included in the electronic device or the industrial equipment.

Some technologies related to such a cooling device are proposed. For example, Japanese Patent No. 3233808 discloses a cooling system operable to move heat from a heating element to a heat radiating member, and to refrigerate the heat. In the '808 Patent, it is assumed that the heating element possessing a large calorific value itself, such as a semiconductor integrated circuit, is a cooling target. The heat from the heating element is conducted to a heat receiving unit, a thermal conductivity element, and a heat radiating unit. Then, the heating element is refrigerated. In other words, when the heat is taken from the heating element, the taken heat is transported by the thermal conductivity element, and the transported heat is conducted by the heat radiating unit. Each of the heat receiving function, the heat transporting function, and the heat radiating function is formed by a different member. Each member is connected each other.

Further, Japanese Patent Application No. 2004-037001 discloses a technology operable to move a refrigerant evaporated by heat from a heating element to another member through a pipe, and to refrigerate the refrigerant by a secondary cooling member such as a heat sink, in the member of another object. Dissimilar to the heat pipe according to the '808 Patent, the function of diffusing the received heat although possessing a plate-like shape, and the function of transporting the diffused heat are unified in a main body possessing the plate-like shape.

Additionally, Japanese Patent Application No. 2003-075083 discloses a technology that a vertically arranged heat pipe transports and radiates heat from a heat source. Finally, Japanese Patent Application No. 6-216555 discloses a technology, in which a cooling device is arranged on the end face of a heat pipe formed in two layers, and thermal diffusion and heat radiating are included.

Since the thermal diffusion function, the heat transporting function, and the heat radiating function shown in the '808 Patent are formed by different members, there is a problem that the heat pipe is enlarged and complicated. The electronic component, which is a target for cooling recently, is a semiconductor integrated circuit considered as large, such as a CPU (Central Processing Unit) or a dedicated IC, or is often a very compact electronic component, such as a high luminance LED (Light-Emitting Device). In such a case, the heat pipe possessing a large-sized and complicated shape is disadvantageous in respect of mounting.

Furthermore, in the hear pipe possessing the thermal diffusion function, the heat transporting function, and the heat radiating function, which are formed by different members and connected mutually, in each of heat movement from the thermal diffusion function to the heat transporting function, and heat transport from the thermal transporting function to the heat radiating function, since the thermal resistance becomes high, the efficiency of the heat movement becomes worse.

As for the heat pipe shown in the '001 Application, the thermal diffusion and the heat transport are unified. However, even if unified, the heat needs to move between different members. Thus, the efficiency from the heat diffusion function to the heat transporting function is still bad. Moreover, since in the heat pipe according to the '001 Application, the fin as a heat radiating member is provided with the predetermined position of the heat pipe, it is necessary to intensively transport the heat to the predetermined position. However, since the thermal diffusion function and the heat transporting function are unified, depending on a shape, a size, an arrangement position, and a calorific value of the heating element, it is hard for the heat of the heating element to efficiently move to the position of the fin. For this reason, as for the heat pipe according to the '001 Application, the thermal diffusion, the heat transport, and the heat radiating are not suitably combined.

The heat pipes shown in the '083 and '555 Applications are plate-like shaped heat pipes, which the heat receiving function and the thermal diffusion function are unified. Since such a plate-like shaped heat pipe is compact and thin, it can be easily mounted on various kinds of apparatus. There are, however, the following problems in the plate-like shaped heat pipes shown in these Applications since the thermal diffusion function, the heat transporting function, and the heat radiating function are realized with a single member: (1) The ability of heat radiating tends to be low (when the capability of heat radiating is low, the condensation of the evaporated refrigerant becomes slower, thus, the cooling ability of the heat pipe becomes low); (2) Since the thermal diffusion and the heat transport are unified, the diffusion direction and the transporting direction of the heat must be the same, and can not be different; and (3) Since the diffusion direction and the transporting direction can not be distinguished with each other, it is difficult to lead the heat to the heat radiating member.

As mentioned above, when the functions possessed by the heat pipe are decomposed, the heat pipe needs to comprise the diffusing function of the heat received from the heating element, the heat transporting function, and the heat radiating function. When all of these functions are formed and combined by the different forms, there are problems that the heat pipe becomes large, and the heat transfer efficiency is deteriorated. On the other hand, if these functions are formed with the single member, the deterioration of cooling ability based on the problems (1) to (3) mentioned above, is caused.

In addition, according to the conventional cooling device, a position of a heating element and a position of heat radiation can not be arranged differently from each other in an electronic device or an industrial apparatus.

Accordingly, a cooling device are requested to possess the following points: (A) The heat can be moved to the heat radiating position located at the position which is different from the position of the heating element with high efficiency; (B) While the thermal diffusion and the heat transport can be distinguished functionally, the decrease of the efficiency for the heat movement can be suppressed to a minimum; (C) Movement of the heat from the heating element to the heat radiating position can be realized also in a complicated shape; (D) Since the cooling device is compact and thin in order not to spoil the miniaturization of an electronic device or an industrial apparatus, it is possible to be mounted to the electronic device or the industrial apparatus; and (E) The cooling ability can be kept high.

SUMMARY OF THE PRESENT APPLICATION

An object of the Present Application is to provide a compact and thin cooling device operable to efficiently transport heat from a heating element to a heat radiating position.

In view of the above problems, there is provided a cooling device according to the Present Application comprising: a thermal diffusion unit operable to diffuse heat taken from a heating element; and a heat transporting unit laminated in a thickness direction of the thermal diffusion unit, the heat transporting unit being operable to transport the heat diffused by the thermal diffusion unit, wherein the thermal diffusion unit comprises: a first upper plate; a first lower plate opposing to the first upper plate; a first internal space formed by laminating the first upper plate and the first lower plate, a refrigerant being able to enter therein; a first vapor diffusion path formed in the first internal space, a vaporized refrigerant being able to be diffused therein; and a first capillary channel formed in the first internal space, a condensed refrigerant being able to circulate therein, wherein the heat transporting unit comprises: a second upper plate; a second lower plate opposing to the second upper plate; a second internal space formed by laminating the second upper plate and the second lower plate, a refrigerant being able to enter therein; a second vapor diffusion path formed in the second internal space, a vaporized refrigerant being able to be diffused therein; and a second capillary channel formed in the second internal space, a condensed refrigerant being able to circulate therein, and wherein one of the first upper plate and the first lower plate of the thermal diffusion unit is composed of the same member as one of the second lower plate and the second upper plate of the heat transporting part.

The cooling device according to the Present Application enables to move heat of a heating element to a heating radiating position located at a position which is different from the position of the heating element with high efficiency, and refrigerate the heating element. Especially, the heat between a thermal diffusing unit operable to diffuse the heat of the heating element and a heat transporting part operable to transport the diffused heat can be moved with high efficiency.

Furthermore, since the thermal diffusing unit and the heat transporting unit move the heat mainly in different directions, the heat from the heating element to the heat radiating position can be flexibly led. Moreover, since each of the thermal diffusing unit and the heat transporting possesses the composition of the heat pipe operable to diffuse the evaporated refrigerant and to circulate the condensed refrigerant, the cooling device can refrigerate the heating element with high efficiency. Furthermore, the cooling device can be constituted in compact and a thin shape.

A first aspect of the Present Application provides a cooling device, comprising: a thermal diffusion unit operable to diffuse heat taken from a heating element; and a heat transporting unit laminated in a thickness direction of the thermal diffusion unit, the heat transporting unit being operable to transport the heat diffused by the thermal diffusion unit, wherein the thermal diffusion unit comprises: a first upper plate; a first lower plate opposing to the first upper plate; a first internal space formed by laminating the first upper plate and the first lower plate, a refrigerant being able to enter therein; a first vapor diffusion path formed in the first internal space, a vaporized refrigerant being able to be diffused therein; and a first capillary channel formed in the first internal space, a condensed refrigerant being able to circulate therein, wherein the heat transporting unit comprises: a second upper plate; a second lower plate opposing to the second upper plate; a second internal space formed by laminating the second upper plate and the second lower plate, a refrigerant being able to enter therein; a second vapor diffusion path formed in the second internal space, a vaporized refrigerant being able to be diffused therein; and a second capillary channel formed in the second internal space, a condensed refrigerant being able to circulate therein, and wherein one of the first upper plate and the first lower plate of the thermal diffusion unit is composed of the same member as one of the second lower plate and the second upper plate of the heat transporting part.

This arrangement enables the cooling device to transport, utilizing the entire thereof, the heat with high efficiency from a position of the heating element to a heat radiating position different or far from the position of the heating element. As a result, the heat of the heating element can be refrigerated at the far heat radiating position although the heating element is compact.

A second aspect of the Present Application provides, in addition to the first aspect, a cooling device as defined in the first aspect wherein the thermal diffusion unit and the heat transporting part further comprise one or more intermediate plates laminated between the first and second upper plates and the first and second lower plates, and wherein the one or more intermediate plates include notched parts constituting the first and second vapor diffusion paths and internal through holes constituting the first and second capillary channels.

This arrangement enables the heat diffusion unit and the heat transporting part, while they are thin and of plate-like shapes, to diffuse the heat in the predetermined direction. Furthermore, thanks to operation of vaporizing and condensing the refrigerant, the heat diffusion unit and the heat transporting part can diffuse and transport the heat with high efficiency.

A third aspect of the Present Application provides, in addition to the first and second aspects, a cooling device wherein the thermal diffusion unit comprises the first vapor diffusion path possessing a first direction, wherein the thermal transporting part comprises the second vapor diffusion path possessing a second direction differing from the first direction, and wherein the first and second directions cross with each other.

This arrangement enables the cooling device to transport, utilizing changing the direction of thermal conductivity from the heat diffusion unit to the heat transporting part, the heat of the heating element to the heat radiating position different from the position of the heating element.

A fourth aspect of the Present Application provides, in addition to the third aspect, a cooling device wherein the thermal diffusion unit diffuses the heat taken from the heating element in the first direction, and wherein the heat transporting unit transports the heat diffused by the thermal diffusion unit in the second direction.

This arrangement enables the cooling device to lead the heat of the heating element in various directions.

A fifth aspect of the Present Application provides, in addition to the third and fourth aspect, a cooling device wherein the first and second directions are substantially perpendicular to each other.

This arrangement enables the heat diffusion unit to conduct the heat to the heat transporting part with high efficiency.

A sixth aspect of the Present Application provides, in addition to the third to fifth aspects, a cooling device wherein the heat transporting part is formed of a plate-like shape possessing a longitudinal direction and a lateral direction, wherein the heat diffusing unit is laminated in an area overlapping a part area of the heat transporting part, and wherein the first direction is parallel to the lateral direction, and the second direction is parallel to the longitudinal direction.

This arrangement enables the cooling device to transport, utilizing the combination of the heat diffusion unit and the heat transporting part, the heat of the heating element to the heat radiating position different or far from the position of the heating element with high efficiency.

A seventh aspect of the Present Application provides, in addition to the sixth aspect, a cooling device wherein the heat transporting part comprises a plurality of paths dividing the internal space along the longitudinal direction.

This arrangement enables the heat transporting part to transport the heat while reducing burden of transport in accordance with how the heat is conducted from the heat diffusion unit.

An eighth aspect of the Present Application provides, in addition to the seventh aspect, a cooling device wherein the plurality of paths further comprises: a groove formed on an inner wall of the plurality of paths along the longitudinal direction; and a communicating path penetrating from one of the plurality of paths to another of the plurality of paths, a refrigerant being able to move through the communicating path.

This arrangement enables each path to exchange the refrigerant. The heat transporting part can balance amount of paths requiring the refrigerant and paths not so.

A ninth aspect of the Present Application provides, in addition to the first to eighth aspects, a cooling device wherein the thermal diffusion unit radially diffuses the heat.

This arrangement enables the heat diffusion unit to conduct the heat in the lateral direction of the heat transporting part with high efficiency.

A tenth aspect of the Present Application provides, in addition to the first to ninth aspects, a cooling device wherein the thermal diffusion unit is laminated in a direction of thickness in an area of either an end of the heat transporting part or a substantial center part of the heat transporting part.

This arrangement enables to transport the heat with high efficiency while keeping the device compact and thin.

An eleventh aspect of the Present Application provides, in addition to the tenth aspect, a cooling device wherein the heat transporting part transports the heat from the end where the thermal diffusion unit has been laminated to another end thereof when the heat diffusion unit has been laminated at the end, and wherein the heat transporting part transports the heat from the substantial center part to the end and the other end when the heat diffusion unit has been laminated at the substantial center part of the heat transporting part.

This arrangement enables the cooling device to transport the heat of the heating element to the heat radiating position different or far from the position of the heating element.

A twelfth aspect of the Present Application provides, in addition to the first to eleventh aspects, a cooling device wherein the heat transporting part further comprises a heat radiating unit provided with at least one end of the longitudinal direction and the lateral direction for radiating transported heat.

This arrangement enables the transported heat to be refrigerated at the position different from the position of the heating element.

A thirteenth aspect of the Present Application provides, in addition to the first to twelfth aspects, a cooling device wherein at least one of the first and second upper plates and first and second lower plates of the heat diffusion unit and the heat transporting part further comprises a recess part communicating with at least one of the first and second vapor diffusion paths and the first and second capillary channels.

A fourteenth aspect of the Present Application provides, in addition to the first to thirteenth aspects, a cooling device wherein the first and second vapor diffusion paths diffuse a vaporized refrigerant in at least one of a thickness direction and a horizontal direction, and wherein the first and second capillary channels cause a condensed refrigerant to circulate in at least one of a vertical direction and vertical and horizontal directions.

These arrangements enable to perform diffusing the vaporized refrigerant and circulating the condensed refrigerant not only in the horizontal direction but also in the vertical direction.

These and other objects, features and advantages of the Present Application will be clearly understood through a consideration of the following detailed description.

BRIEF DESCRIPTION OF THE FIGURES

The organization and manner of the structure and operation of the Present Application, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

Figure 1:
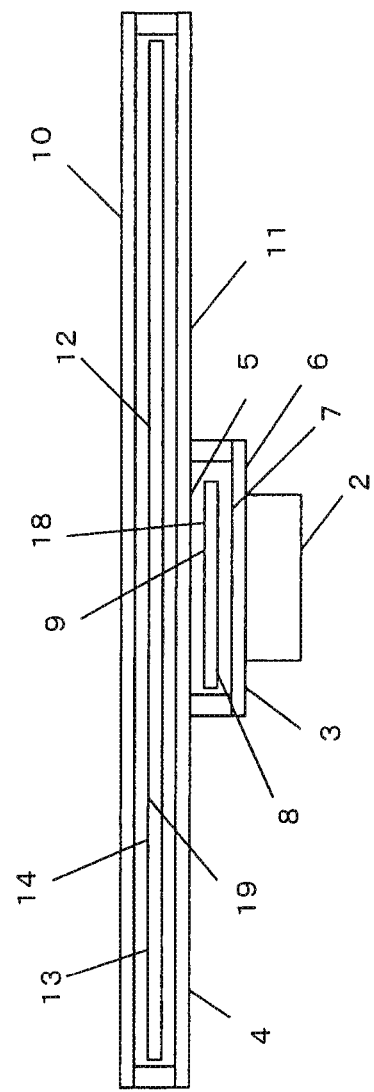
FIG. 1 is a side view of a cooling device in Embodiment 1 according to the Present Application.

While the Present Application may be susceptible to embodiment in different forms, there is shown in the Figures, and will be described herein in detail, specific embodiments, with the understanding that the disclosure is to be considered an exemplification of the principles of the Present Application, and is not intended to limit the Present Application to that as illustrated.

In the illustrated embodiments, directional representations—i.e., up, down, left, right, front, rear and the like, used for explaining the structure and movement of the various elements of the Present Application, are relative. These representations are appropriate when the elements are in the position shown in the Figures. If the description of the position of the elements changes, however, it is assumed that these representations are to be changed accordingly.

Hereinafter, a "heat pipe" in this specification means a member, a part, an apparatus or a device possessing a function of refrigerating a heating element. The heating element heats a refrigerant entered in an internal space of the heat pipe to evaporate, and then the evaporated refrigerant is refrigerated to be condensed. The function is achieved by repeating the above. Moreover, a "heat transporting unit" in this specification means a member, a part, an apparatus, or a device possessing a function of transporting heat from the heating element by the movement of the refrigerant.

Since the cooling device according to the Present Application utilizes a function and an operation of the heat pipe, concept of a heat pipe will be explained first.

The heat pipe seals a refrigerant in the inside thereof, and possesses a heat-receiving surface in contact with a heating element including an electronic part. The internal refrigerant is heated by the heating element to evaporate, and takes the heat of the heating element when evaporating. The vaporized refrigerant circulates in the inside of the heat pipe. The flow carries the heat of the heating element. The flowing and vaporized refrigerant is refrigerated to be condensed at a heat radiating surface, or the like (or a secondary cooling member, such as a heat sink and a cooling fan). The refrigerant condensed to be a liquid circulates the inside of a heat pipe, and moves to a heat-receiving surface again. The refrigerant moved to the heat-receiving surface is evaporated again, and takes the heat of a heating element.

By repetition of vaporization and condensation, the heat pipe refrigerates the heating element. For this reason, the heat pipe preferably includes: a vapor diffusion path for diffusing the refrigerant therein; and a capillary channel for flowing back the condensed refrigerant.

There are: a heat pipe of a cylindrical shape possessing a structure for diffusing a refrigerant in a vertical direction to flow back a condensed refrigerant in the same direction; a heat pipe possessing a structure that a heat receiving unit connects with a heating element; and a cooling unit for refrigerating the refrigerant are constituted independently from each other, the heat receiving unit and the cooling unit being connected with a pipe, and so on.

Since the heat pipes having such structures possess large volume (especially, the volume tends to be large in the vertical direction), the heat pipes are not suitable for a case whose mounting space is narrow. For this reason, a thin heat pipe of a plate-like shape is desired in many cases, and the plate-like heat pipe is also suggested. According to the conventional technology, it is difficult to constitute a heat pipe of a plate-like shape. The inventors, however, laminating a plurality of thin substrates, have realized forming a vapor diffusion path and a capillary channel in a thin internal space by providing the laminated substrates with a notched part and a through hole.

FIG. 1 is a side view of the cooling device in Embodiment 1 according to the Present Application. A cooling device 1 is provided with: a thermal diffusing unit 3 operable to diffuse heat taken from a heating element 2; and a heat transporting part 4, which is laminated in a thickness direction of the thermal diffusing unit 3, operable to transport the heat diffused by the thermal diffusing unit 3. The thermal diffusing unit 3 and the heat transporting part 4 possess plate-like shapes. The plate-like shape is suitable, but the shape is not limited to the plate-like shape. The thickness, size, and shape of the thermal diffusing unit 3 and the heat transporting part 4 may be defined suitably.

The thermal diffusing unit 3 is provided with: an upper plate 5; a lower plate 6 opposing to the upper plate 5; an internal space 7, which is formed by the laminating the upper plate 5 and the lower plate 6, operable to seal a refrigerant therein. In addition, the thermal diffusing unit 3 is provided with: a vapor diffusion path 8 operable to diffuse the vapor refrigerant; and a capillary channel 9 operable to circulate the condensed refrigerant, and the vapor diffusion path 8 and the capillary channel 9 are formed in the internal space 7. In addition, in order to form the internal space 7 by laminating the upper plate 5 and the lower plate 6, a projection or the like is provided with the periphery of the upper plate 5 and the lower plate 6. Since the laminated upper plate 5 and the lower plate 6 possess a certain distance, the internal space 7 is formed by the projection.

The heat transporting part 4 also possesses the same structure as the thermal diffusing unit 3. That is, the heat transporting part 4 is provided with: an upper plate 10; a lower plate 11 opposing to the upper plate 10; an internal space 12 operable to seal a refrigerant formed by the laminating the upper plate 10 and the lower plate 11. In addition, the heat transporting part 4 is provided with: a vapor diffusion path 13 operable to diffuse the evaporated refrigerant; and a capillary channel 14 operable to circulate the condensed refrigerant, and the vapor diffusion path 13 and the capillary channel 14 is formed in the internal space 12. In order to form the internal space 12 by laminating the upper plate 10 and the lower plate 11, a projection or the like is provided with the periphery of the upper plate 10 and the lower plate 11, and laminated. Since the laminated upper plate 10 and the lower plate 11 possess a certain distance, the internal space 12 is formed by the projection.

The internal space 7 and the internal space 12 seal the refrigerant therein. By the heat from the heating element 2, the refrigerant repeats evaporating, diffusing, condensing, and circulating. By repetition of vaporization and condensation, each of the thermal diffusing unit 3 and the heat transporting part 4 possesses the heat pipe function of refrigerating the heat of the heating element 2.

The cooling device 1 refrigerates the heating element 2 as follows. The heating element 2 is provided with the bottom face of the thermal diffusing unit 3. The heating element 2 may be provided with the bottom face of the thermal diffusing unit 3 by directly contacting to the face, and may be provided via a thermal interface material. When the thermal diffusing unit 3 takes heat from the heating element 2, the refrigerant existing in the internal space 7 will evaporate. The vaporized refrigerant goes through the vapor diffusion path 8, and diffuses the inside of the internal space 7. By the diffusion of the evaporated refrigerant, the thermal diffusing unit 3 diffuses the heat taken from the heating element 2. The heat transporting part 4 receives the heat diffused by the thermal diffusing unit 3. In the heat transporting part 4, when the thermal diffusing unit 3 receives the diffused heat (since the heat transporting part 4 is laminated in the thickness direction of the thermal diffusing unit 3, the thermal diffusing unit 3 is the heating element for the heat transporting part 4), the refrigerant entered in the internal space 12 will evaporate. The vaporized refrigerant moves by going through the vapor diffusion path 13. By the movement of the evaporated refrigerant, the heat transporting part 4 transports the heat received from the thermal diffusing unit 3 in the predetermined direction. The transported heat may be refrigerated at the predetermined part of the heat transporting part 4, or may be refrigerated in the heat radiating unit which the heat transporting unit 4 is provided with/connects to. That is, in the cooling device 1, the heat transporting part 4 finally transports the heat from the heating element 2 to the predetermined position.

The heat radiating unit is often located at the position, which is away from the setting position of the heating element 2 or the position of the thermal diffusing unit 3. In such a case, it is necessary to transport the heat of the heating element 2 to the heat radiating unit with high efficiency. The cooling device 1 can transport the heat taken from the heating element 2 to the heat radiating unit connected to the heat transporting unit 4 via the thermal diffusing unit 3 and the heat transporting part 4. In particular, since both of the thermal diffusing unit 3 and the heat transporting part 4 possess the function of the heat pipe operable to move the heat by the vaporization and condensation of the refrigerant, it is possible to move the heat with high efficiency.

As clearly shown in FIG. 1, the upper plate 5 of the thermal diffusing unit 3 and the lower plate 11 of the heat transporting part 4 are formed with the same member. The lower plate 11 of the heat transporting part 4 is also the upper plate 5 of the heat transporting part 3. Since the upper plate 5 of the thermal diffusing unit 3 and the lower plate 11 of the heat transporting unit 4 are formed with the same member, the thermal resistance between the thermal diffusing unit 3 and the heat transporting part 4 becomes small. The cooling device 1 transports the heat of the heating element 1 in the combination of two elements called as the thermal diffusing unit 3 and the heat transporting part 4 in the heat of the heating element 2. When the transporting is performed with one element, there are the following problems: (1) There is no flexibility in a transporting direction; and (2) An element becomes larger, thus, the efficiency of transporting reduces. On the other hand, the cooling device 1 of Embodiment 1 combines the two elements of the thermal diffusing unit 3 and the heat transporting part 4, and reduces the thermal resistance between the elements, for which some attention are required when combining the two elements, by the communalization of members. Since connecting parts of the upper plate 5 of the thermal diffusing unit 3 and the lower plate 11 of the heat transporting part 4 are composed of the same member, there is no air layer or space between the members, thus, the thermal resistance is reduced (normally, a factor of raising the thermal resistance is an air layer).

The cooling device 1 laminates and combines the thermal diffusing unit 3 and the heat transporting part 4 in the thickness direction. The heat of the heating element 2 can be moved to the heat radiating unit with high efficiency by forming the members in the part contacting due to the lamination (the upper plate 5 of the thermal diffusing unit 3, and the lower plate 6 of the heat transporting part 4) by the same member.

In addition, in FIG. 1, since the heat transporting part 4 is laminated on the thermal diffusing unit 3, the upper plate 5 of the thermal diffusing unit 3 and the lower plate 11 of the heat transporting part 4 are formed with the same member. When laminating them in the opposite direction, the lower plate 6 of the thermal diffusing unit 3 and the upper plate of the heat transporting part 4 are formed with the same member.

The words of "upper" and "lower" of the upper plate and the lower plate are just for distinguisher. In other words, they do not mean that the one plate is physically higher than the other one.

Next, the cooling device 1, wherein the directions of the heat movement for the thermal diffusing unit 3 and the heat transporting part 4 are different, will be explained. Since the thermal diffusing unit 3 and the heat transporting part 4 are laminated in the thickness direction, the cooling device 1 of Embodiment 1 can move the heat of the heating element with high efficiency. However, when each of the directions of heat movement for the thermal diffusing unit 3 and the heat transporting part 4 is different, the heat movement of the heating element 2 will be more flexible.

Figure 2:
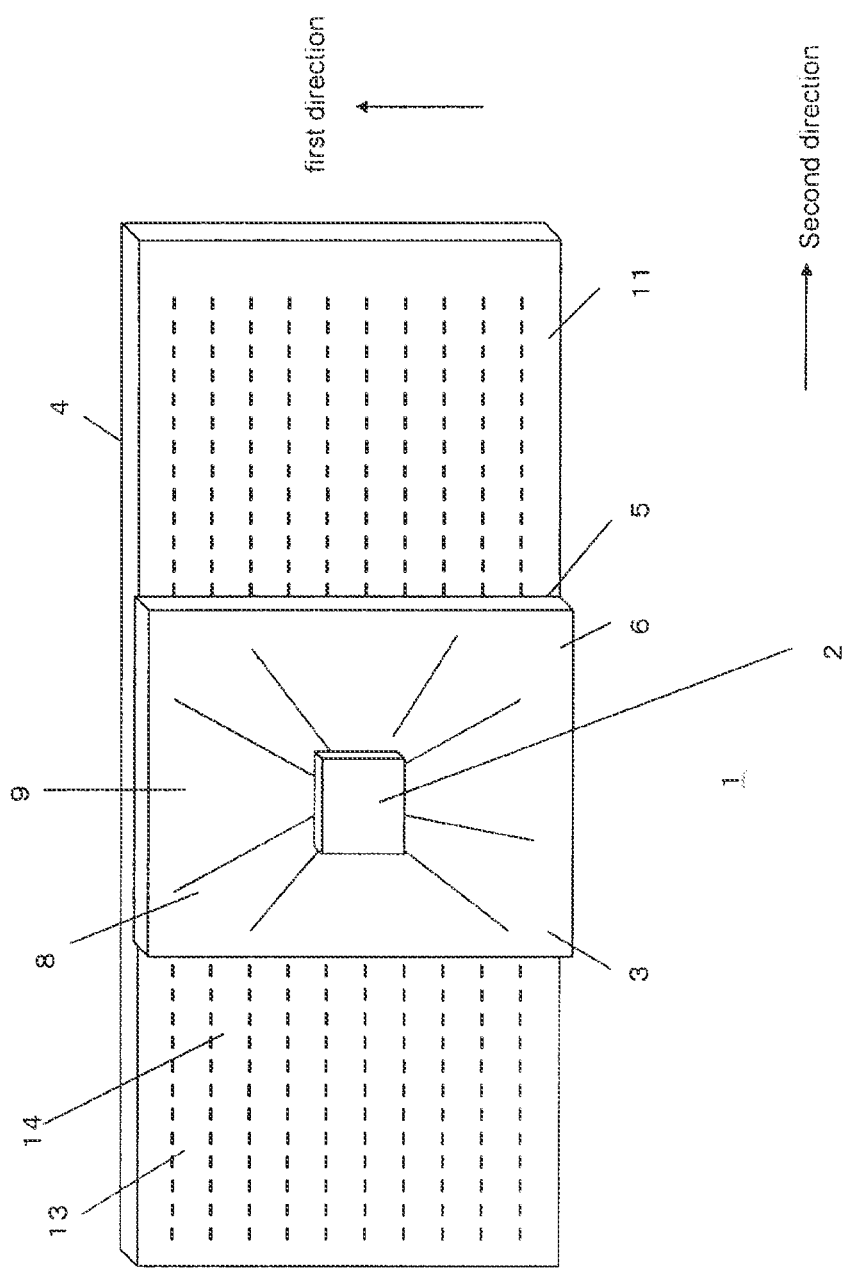
FIG. 2 is a perspective view of the cooling device of Embodiment 1 according to the Present Application.

FIG. 2 shows the state where the cooling device 1 is seen from the side of the heating element 2. The heating element 2 is provided with the bottom face of the thermal diffusing unit 3. The heat transporting part 4 is laminated on the thermal diffusing unit 3 in the thickness direction. The upper plate 5 of the thermal diffusing unit 3 and the lower plate 11 of the heat transporting part 4 are formed with the same member.

Here, the thermal diffusing unit 3 diffuses the heat in a predetermined first direction. That is, the thermal diffusing unit 3 is provided with the vapor diffusion path 8 possessing the first direction. In FIG. 2, the thermal diffusing unit 3 is provided with the vapor diffusion path 8, which is radially extended from the center to the periphery. Even if it is radially, it still possesses the first direction. Here, even if it includes a direction which is different from the first direction, possessing the first direction means possessing the diffusing direction of heat in the first direction (that is, the vapor diffusion path 8).

On the other hand, the heat transporting part 4 transports the heat in a second direction that is different from the first direction. That is, the heat transporting part 4 is provided with the vapor diffusion path 13 possessing the second direction. The second direction is a different direction from the first direction. The first direction and the second direction cross mutually. In FIG. 2, the heat transporting part 4 is provided with the vapor diffusion path 13 possessing the second direction as shown by the dotted lines. Since the vapor diffusion path 13 possesses the second direction, the heat transporting part 4 transports the heat received from the thermal diffusing unit 3 in the second direction. For example, when the thermal diffusing unit 3 is laminated mostly at the center of the heat transporting part 4, the heat transporting part 4 transports the heat received at around the center from the thermal diffusing unit 3 to the both end parts in the second direction. Thus, the heat transported in the second direction reaches to the both end parts of the heat transporting part 4, and is refrigerated in the both end parts of the heat transporting part 4.

In addition, as long as the second direction is a direction which is different from the first direction, a case where the diffusing direction for the heat included in the thermal diffusing unit 3 is at least partially same as the second direction is not excluded.

Details of the above is explained based on movement of a refrigerant. The thermal diffusing unit 3 takes the heat of the heating element 2. At this time, when the heating element 2 is provided near the center of the thermal diffusing unit 3, the refrigerant, which has received the heat, evaporates near the center of the thermal diffusing unit 3. The vaporized refrigerant is diffused through the vapor diffusion path 8 that is formed radially (the first direction is included). By the diffusion of the evaporated refrigerant, the heat from the heating element 2 is diffused radially.

By the diffusion or while diffusing, the evaporated conducts the heat being transported to the heat transporting part 4 via the upper plate 5 of the thermal diffusing unit 3. At this time, since the upper plate 5 of the thermal diffusing unit 3 and the lower plate 11 of the heat transporting part 4 are formed with the same member, there is no excessive thermal resistance. Thus, the heat can be conducted with high efficiency from the thermal diffusing unit 3 to the heat transporting part 4.

Moreover, in the thermal diffusing unit 3, the evaporated refrigerant diffusing radially (including the first direction) conducts the heat to the heat transporting part 4 at various kinds of place such as in the middle and at the end part of the lateral direction of the heat transporting part 4. For this reason, the heat transporting part 4 can receive the heat from the thermal diffusing unit 3 in the thermal diffusing unit 3 and the most of the positions for the laminated region. As a result, the heat transporting part 4 transports the heat received from the thermal diffusing unit 3 in the second direction by using the most of the region of the lateral direction. This is in the state where the heat from the thermal diffusing unit 3 is transported along the most of the plurality of dotted lines described at the heat transporting part 4 in FIG. 2.

The thermal diffusing unit 3 is provided with the vapor diffusion path 8 possessing the first direction, and diffuses the heat in the first direction. The heat transporting part 4 is provided with the vapor diffusion path 13 possessing the second direction, and transports the heat in the second direction. In the heat movement from the thermal diffusing unit 3 to the heat transporting part 4, since the upper plate 5 of the thermal diffusing unit 3 and the lower plate 11 of the heat transporting part 4 are formed with the same member, the heat can be easily moved from the upper plate 5 of the thermal diffusing unit 3 to the heat transporting part 4. Since the heat resistance among the heat diffusing direction of the thermal diffusing unit 3, the thermal diffusing unit, and the heat transporting part 4 is small, the heat transporting part 4 receives the heat from the entire thermal diffusing unit 3 more easily.

The heat transporting part 4 transports the heat received from the entire thermal diffusing unit 3 in the second direction, which is different from the first direction. Since receiving the heat from the entire thermal diffusing unit 3 means receiving the heat in the direction spreading to the lateral direction of the heat transporting part 4, the heat transporting part 4 can transport the heat in the second direction attaining to the entire lateral direction. In other words, the heat can be transported in the second direction, which is a longitudinal direction, by using all of the width thereof.

In addition, in the thermal diffusing unit 3, the refrigerant diffused through the vapor diffusion path 8 is condensed by conducting the heat to the heat transporting part 4. Then, it returns to the liquid refrigerant, and circulates through the capillary channel 9. Although the details of the capillary channel 9 are not shown in FIGS. 1 and 2, the capillary channel 9 circulates the condensed refrigerant according to capillarity. The circulated refrigerant collects near the center of the thermal diffusing unit 3 again, and evaporates by the heat of the heating element 2. The evaporated refrigerant diffuses through the vapor diffusion path 8.

On the other hand, the refrigerant diffused through the vapor diffusion path 13 of the heat transporting part 4 is refrigerated and condensed in the middle of diffusion or after the diffusion. The condensed refrigerant circulates through the capillary channel 14. The refrigerant, which is condensed by the recirculation, collects near the position laminated with the thermal diffusing unit 3. The refrigerant evaporates again by the heat from the thermal diffusing unit 3, and then diffuses.

The thermal diffusing unit 3 and the heat transporting part 4 moves the heat according to repetition of vaporization and condensation of the refrigerant, consequently refrigerates the heat of the heating element 2.

When the heating element 2 is a very large electronic component, transporting may be performed by directly taking the heat from the electronic component. In this case, it can be dealt with the cooling device provided with only the heat transporting part 4. That is, combining by laminating the thermal diffusing unit 3 and the heat transporting part 4 in the thickness direction is not necessary.

However, in recent years, there is a request for refrigerating a very compact heating element, such as a light emitting element like an LED, and a compact semiconductor LSI. In such a case, when the cooling device is provided with only the heat transporting part 4, the heat transporting part 4 can transport the heat only in the specific direction from the position where the compact heating element is provided. For this reason, the heat can not be transported by using the entire heat transporting part 4. This is because only the vapor diffusion path 13 related to the position where the compact heating element is used.

On the contrary, even when the heating element 2 is compact as shown in FIGS. 1 and 2, the cooling device 1 of Embodiment 1 first diffuses the heat of the heating element in the first direction, which is the lateral direction of the heat transporting part 4. Afterwards, the heat transporting part 4 transports the heat diffused in the lateral direction in the second direction (the second direction is a direction connecting to the heat radiating unit operable to radiate the transported heat). Thus, the heat transporting part 4 can transport the heat of the heating element 2, which is compact (comparing to the size of the heat transporting unit 4), by using the entire of itself.

It is suitable that: the heat transporting part 4 is a plate-like shape possessing the lateral direction and the longitudinal direction; the thermal diffusing unit 3 is laminated in a region, which is overlapped with the part of region of the heat transporting part 4; the first direction is parallel to the lateral direction; and the second direction is parallel to the longitudinal direction.

In the cooling device 1 of Embodiment 1, the thermal diffusing unit 3 and the heat transporting part 4 are laminated in the thickness direction via the same member. In addition, the thermal diffusing unit 3 diffuses the heat in the first direction, which is the lateral direction of the heat transporting part 4, and transports the heat in the second direction being parallel to the longitudinal direction of the heat transporting part 4. As a result, even when the heating element 2 is compact, the heat of the heating element 2 can be transported to the position where the heat radiating unit exits or the position where the heat radiating unit can easily radiate, by utilizing the entire cooling device 1.

Figure 3:
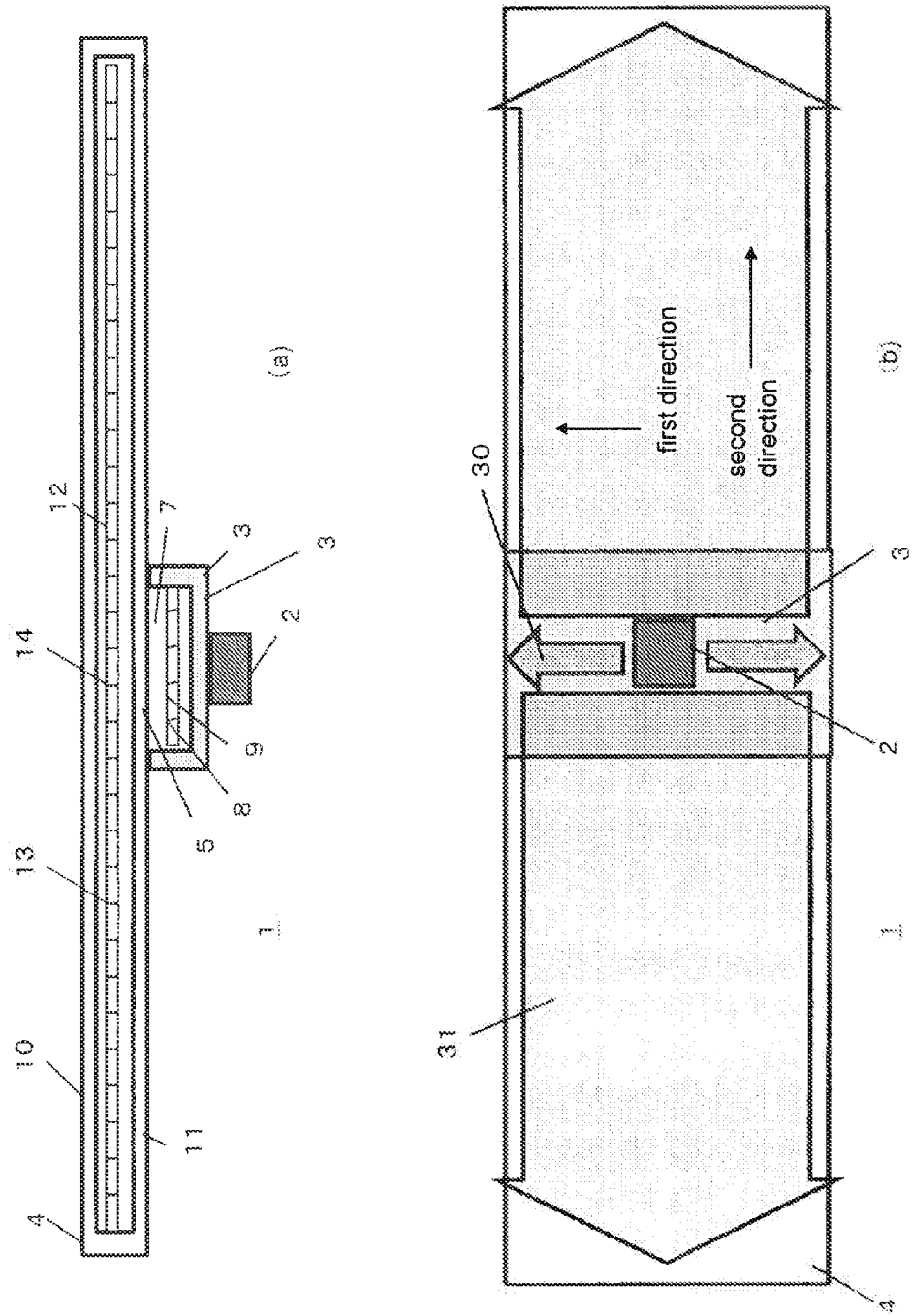
FIG. 3 is a conceptual diagram of the cooling device of Embodiment 1 according to the Present Application.
Figure 4:
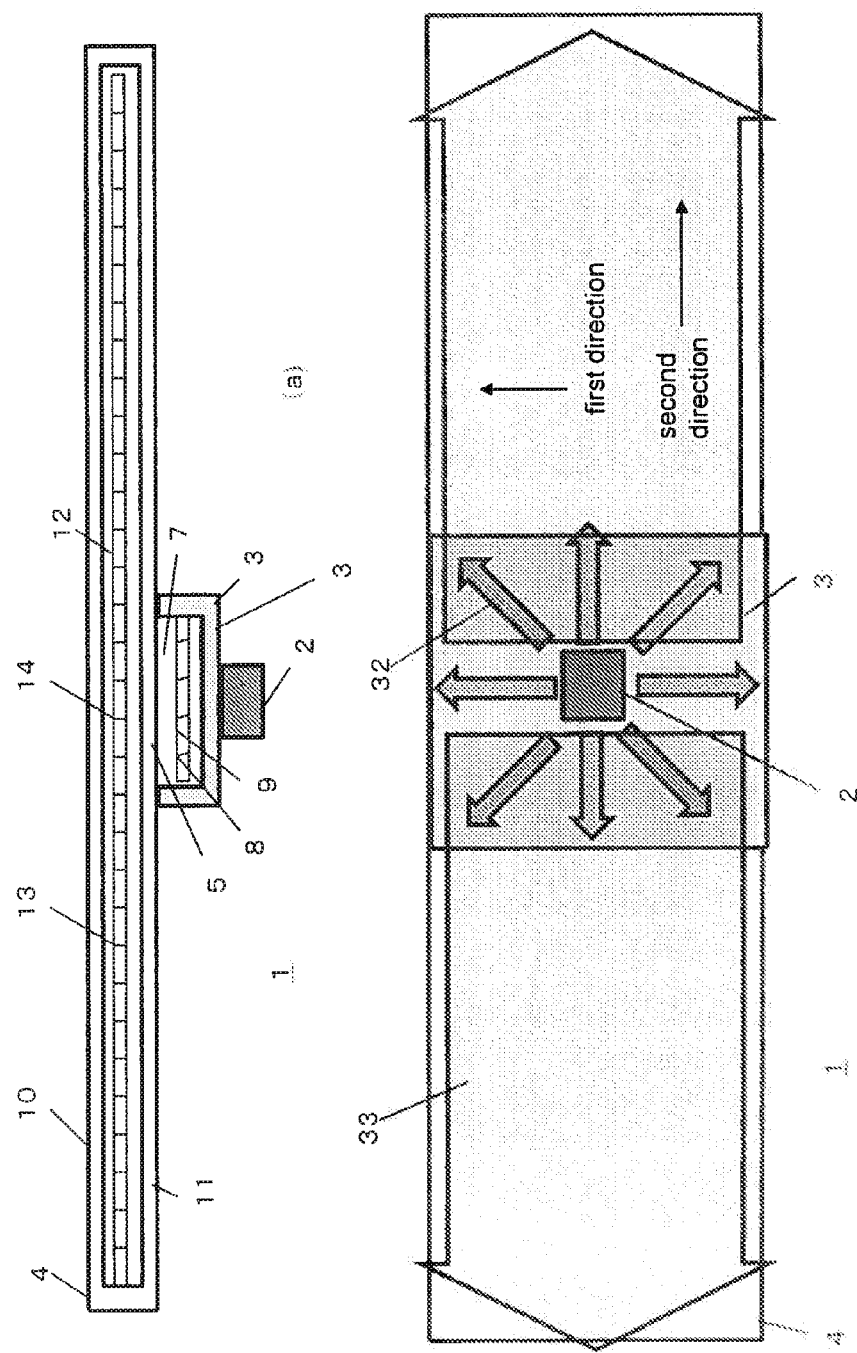
FIG. 4 is a conceptual diagram of the cooling device of Embodiment 1 according to the Present Application.

The cooling device possessing the combination of the heat movement in the first direction and the second direction as mentioned above will be explained using FIG. 3 and FIG. 4. FIG. 3 and FIG. 4 are conceptual diagrams of the cooling device of Embodiment 1 according to the Present Application. FIG. 3 (a) and FIG. 4 (a) show the side view of the cooling device. FIG. 3 (b) and FIG. 4 (b) show the front view of the cooling device.

In the cooling device 1 shown in FIG. 3, the thermal diffusing unit 3 is the bottom face of the heat transporting part 4, and is laminated at the region, which is overlapped with the part of region of the heat transporting part 4. Furthermore, the thermal diffusing unit 3 is provided with near the center of the heat transporting part 4. Here, the heat transporting part 4 is a plate-like shape which possesses the lateral direction and the longitudinal direction. The first direction is parallel to the lateral direction. The second direction is parallel to the longitudinal direction. Moreover, the first direction and the second direction cross mutually, and are substantially perpendicular to each other.

In the cooling device 1 of FIG. 3, the thermal diffusing unit 3 diffuses the heat in the first direction. For example, the thermal diffusing unit 3 possessing the vapor diffusion path 8 in the first direction diffuses the heat taken from the heating element 2 in the first direction. An arrow 3 shows a direction, which the thermal diffusing unit 3 diffuses the heat. The heat, which is diffused by the thermal diffusing unit 3, is conducted to the heat transporting part 4 via the upper plate 5 which is the same member. At this time, by diffusing the heat in the first direction, the heat of the heating element 2 is conducted in the entire lateral direction of the heat transporting part 4.

Next, the heat transporting part 4 transports the heat conducted by the thermal diffusing unit 3 being parallel to the second direction. In FIG. 3, the heat is transported to the both sides in the second direction from near the center of the heat transporting part 4. An arrow 31 shows the second direction which is the direction of heat-transporting. Since the both ends of the heat transporting part 4 are considerably distant from the heating element 2, the moved vaporization refrigerant is easily refrigerated. For this reason, near the both ends of the heat transporting part 4 possesses the function of the heat radiating unit. After refrigerating by the heat radiating, the refrigerant is condensed, circulates through the capillary channel 14, and transports the heat again.

In the cooling device 1 shown in FIG. 4, the thermal diffusing unit 3 is the bottom face of the heat transporting part 4, and is laminated in the region that is overlapped with the part of region of the heat transporting part 4. Furthermore, the thermal diffusing unit 3 is provided near the center of the heat transporting part 4. Here, the heat transporting part 4 is a plate-like shape possessing a lateral direction and a longitudinal direction. The first direction is parallel to the lateral direction. The second direction is parallel to the longitudinal direction. Moreover, the first direction and the second direction cross mutually, and are substantially perpendicular to each other.

In the cooling device 1 of FIG. 4, the thermal diffusing unit 3 diffuses the heat radially including the first direction. For example, the thermal diffusing unit 3 possesses the vapor diffusion path 8 which is radially formed. An arrow 32 diffusing the heat taken from the heating element 2 radially including the first direction indicates the radiating direction, which the thermal diffusing unit 3 diffuses the heat. The heat, which is diffused by the thermal diffusing unit 3, is conducted to the heat transporting part 4 via the upper plate 5 which is the same member. At this time, by diffusing the heat radially, the heat of the heating element 2 is conducted to the entire lateral direction of the heat transporting part 4. As shown in FIG. 3, comparing to a case where the heat is diffused in only the first direction, diffusing radially including the entire lateral direction conducts the heat more efficiently by the heat transporting part 4. For this reason, the thermal diffusing unit 3 can conduct the heat to the heat transporting part 4 with high efficiency.

Next, the heat transporting part 4 transports the heat conducted by the thermal diffusing unit 3 in the second direction. In FIG. 4, the heat is transported from near the center of the heat transporting part 4 in FIG. 4 to the both sides being parallel to the second direction. An arrow 33 shows the second direction which is the direction of heat transporting. Since the both ends of the heat transporting part 4 are considerably distant from the heating element 2, the moved vaporization refrigerant can be easily reradiated. For this reason, near the both ends of the heat transporting part 4 possess the function of the heat radiating unit. After refrigerating by the heat radiating, the refrigerant is condensed, circulates through the capillary channel 14, and transports the heat again.

Thus, the cooling device 1 shown in FIG. 3 or FIG. 4 can efficiently refrigerate the compact heating element 2 by suitably combing: the thermal diffusing unit 3 operable to diffuse the heat from the compact heating element 2; and the heat transporting part 4 operable to transport the heat to the second direction.

In addition, what radiates the heat transported by the heat transporting part 4 may be the part easily touching to the open air like the end part of the heat transporting part 4 and/or a member performing the heat radiating to the open air and thermally touching to the heat transporting part.

Moreover, it is also suitable that a fan operable to refrigerate the end part of the heat transporting part 4 is provided.

Next, the details of each unit are explained. First, the thermal diffusing unit 3 will be explained. The thermal diffusing unit 3 is formed in the first layer of the cooling device 1. The thermal diffusing unit 3 is provided with: the upper plate 5; the lower plate 6 opposing to the upper plate 5; and one or a plurality of the intermediate plates 18, which is laminated between the upper plate 5 and the lower plate 6. In addition, the intermediate plate 18 is arbitrarily provided. Moreover, the thermal diffusing unit 3 is provided with: the internal space 7 operable to seal the refrigerant formed by connecting the upper plate 5 and the lower plate 6; and the vapor diffusion path 8 and the capillary channel 9 formed by the intermediate plate 18. The vapor diffusion path 8 diffuses the evaporated refrigerant by the heat. The capillary channel 9 circulates the refrigerated and condensed refrigerant.

Moreover, the upper plate 5 is formed with the member, which is the same member of the lower plate 11 of the heat transporting part 4. In FIG. 1, the part of the lower plate 11 of the heat transporting part 4 forms the upper plate 5 of the thermal diffusing unit 3 as it is. By forming the upper plate 5 of the thermal diffusing unit 3 with the member which is as same as that of the lower plate 11 of the heat transporting part 4, the thermal resistance in the connecting part of the thermal diffusing unit 3 and the heat transporting part 4 is small. Thus, the heat movement from the thermal diffusing unit 3 to the heat transporting part 4 is hardly interrupted.

By sealing the refrigerant to the internal space 7 and comprising the vapor diffusion path 8 operable to diffuse the evaporated refrigerant and the capillary channel 9 operable to circulate the condensed refrigerant, the thermal diffusing unit 3 diffuses the heat in the first direction. Here, the vapor diffusion path 8 is formed with the notched part provided with the intermediate plate 18. Since the notched part possesses the shaper being parallel to the first direction, the vapor diffusion path 8 can diffuse the evaporated refrigerant in the first direction. Furthermore, the vapor diffusion path 8 diffuses the evaporated refrigerant in the horizontal direction and the vertical direction.

The capillary channel 9 is formed in the portion except where the vapor diffusion path 8 is formed in the intermediate plate 18. The capillary channel 9 circulates the condensed refrigerant in the vertical direction or the vertical and horizontal directions. Since the air pressure decreases in the area where vapor is produced by evaporating the refrigerant, the condensed refrigerant circulates in the area where the air pressure is decreased. Since the evaporated refrigerant is diffused in the thickness direction and the horizontal direction, the evaporated refrigerant is refrigerated in various places of the outer wall of the thermal diffusing unit. Especially, in the contacting area of the heat transporting part 4 which is connected via the upper plate 5, since the condensed refrigerant, which the heat transporting part 4 seals, has collected, the refrigerant evaporated inside of the thermal diffusing unit 3 is easy to be refrigerated.

Since the capillary channel 9 circulates the refrigerant, which is refrigerated and condensed at various places by the capillarity, in the vertical direction or the vertical and horizontal directions, the condensed refrigerant is collected efficiently at the position where the heating element 2 is provided.

Since the condensed refrigerant is surely circulated to the position where the heating element 2 is provided, the circulated refrigerant is used again for receiving the heat from the heating element 2. In addition to the efficient diffusion of the evaporated refrigerant, since the condensed refrigerant circulates with high efficiency, the diffusion efficiency of the heat is improved (since the repetition of the diffusion of the evaporated refrigerant and the circulation of the condensed refrigerant is performed at high speed). Thus, the thermal diffusing unit 3 diffuses the heat taken from the heating element 2 to the first direction.

The heat transporting part 4 is formed in the second layer of the cooling device 1. That is, the heat transporting part 4 is laminated in the thickness direction of the thermal diffusing unit 3. Furthermore, the heat transporting part 4 is formed so that the thermal diffusing unit 3 may overlap a part of area of the heat transporting part 4.

The heat transporting part 4 is provided with: the upper plate 10; the lower plate 11 opposing to the upper plate 10; and one or a plurality of the intermediate plates 19, which is laminated between the upper plate 10 and the lower plate 11. Moreover, the heat transporting part 4 is provided with: the internal space 12 operable to seal the refrigerant formed by connecting the upper plate 10 and the lower plate 11; and the vapor diffusion path 13 and the capillary channel 14 formed by the intermediate plate 19. The vapor diffusion path 13 diffuses the refrigerant, which is evaporated by the heat conducted by the thermal diffusing unit 3, in the second direction. The capillary channel 14 causes the refrigerated and condensed refrigerant to circulate therein.

Moreover, the member of the lower plate 11 is the same member of the upper plate 5 of the thermal diffusing unit 3. In addition, since the names of the upper plate and the lower plate are not specially distinguished, the upper plate and the lower plate can be the other way around. This is the same also in the thermal diffusing unit 3. The lamination can be formed the lower plate 6 of the thermal diffusing unit 3 and the upper plate 10 of the heat transporting part 4 with the same member.

Since the heat transporting part 4 possesses the refrigerant entered in the internal space 12, and comprises: the vapor diffusion path 13 operable to diffuse the evaporated refrigerant; and the capillary channel 14 operable to cause the condensed refrigerant to circulate therein, the heat transporting part 4 can transport the heat in the second direction. Here, the second direction is a direction that crosses and is different from the first direction. It is preferable that the first direction and the second direction are substantially vertical to each other.

The vapor diffusion path 13 is formed with the notched part provided in the intermediate plate 19. Since the notched part possesses the shape, which is parallel to the second direction, the vapor diffusion path 13 can diffuse the evaporated refrigerant in the second direction. Moreover, the capillary channel 14 is formed in a portion except where the vapor diffusion path 13 is formed in the intermediate plate 19. The capillary channel 14 causes the condensed refrigerant to circulate in the vertical direction or the vertical and horizontal directions. Since the air pressure decreases in the area where the vapor is produced by the circulation of the refrigerant, the condensed refrigerant can easily circulate in the area where the air pressure has decreased. Although the evaporated refrigerant is diffused in the thickness and horizontal directions, it moves to the both end parts of the heat transporting part 4. Since the both end parts of the heat transporting part 4 are in the state of being easy to radiate the heat, the vaporized refrigerant is refrigerated. Since the refrigerated and condensed refrigerant is circulated in the vertical direction or the vertical and horizontal directions by utilizing the capillary channel 14 being parallel to the second direction, the condensed refrigerant is collected in the area where the heat transporting part 4 touches to the thermal diffusing unit 3.

Thus, in the heat transporting part 4, by the conduction of the heat from the thermal diffusing unit 3, the diffusion of the vaporized refrigerant directed to both the end parts from the thermal diffusing unit 3 and the circulation of the condensed refrigerant directed to the thermal diffusing unit 3 from the both end parts are repeated. Since the vapor diffusion path 13 and the capillary channel 14 are formed in the second direction, the diffusion of the evaporated refrigerant and the circulation of the condensed refrigerant are performed in the second direction.

As a result, the heat transporting part 4 can transport the heat received from the thermal diffusing unit 3 in the second direction. After the heat is transported, it reaches to the both end parts of the heat transporting part 4, and then is radiated.

For example, when a heat radiating unit, such as a heat radiating fin or a cooling fan, is provided with the both end parts of the heat transporting part 4, the heat reached to the both end parts are refrigerated with higher efficiency.

Figure 5:
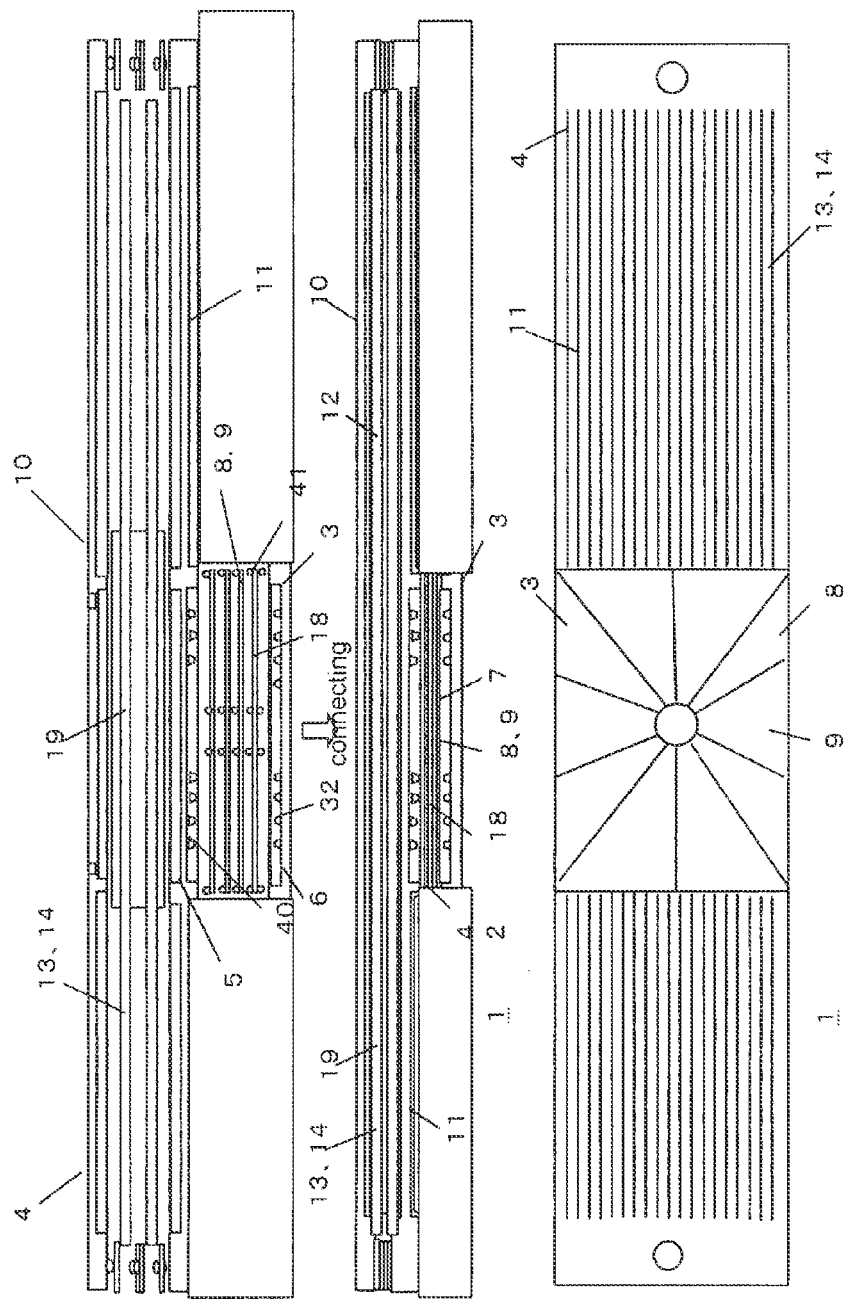
FIG. 5 is an assembly drawing of the cooling device of Embodiment 1 according to the Present Application.

Next, details of each member will be explained referring to FIG. 5. FIG. 5 is an assembly drawing of the cooling device of Embodiment 1 according to the Present Application. FIG. 5 shows an exploded view, a side view (each member shown in the exploded view completes the side view), and a front view of the cooling device from the top.

The upper plates 5 and 10 will be explained. In addition, the upper plates 5 and 10 are commonly explained, because there is only difference that a target of one of them is the thermal diffusing unit 3 and a target of the other of them is the heat transporting part 4 between the upper plates 5 and 10.

The upper plates 5 and 10 possess the predetermined shape and area. In FIG. 5, although upper plates 5 and 10 are formed of the plate-like shape, the shape may be curved, crooked, or refracted. Although the upper plates 5 and 10 are formed of metal, resin, or the like, they are preferably formed of metal with high thermal conductivity, such as copper, aluminum, silver, aluminum alloy, iron, iron alloy, and stainless steel, or rust-free (high durability) metal. The upper plates 5 and 10 may be of one of various shapes, such as a rectangle, a lozenge, a circle, an ellipse, and a polygon.

It is preferable that the upper plate 5 is a side of the upper plate 5, and possesses a groove in the side of the internal space 7 being parallel to the first direction. It is also preferable that the upper plate 10 is a side of the upper plate 10, and possesses a groove in the side of the internal space 12 being parallel to the second direction. This is because it becomes easy to control the direction for the diffusion (transportation) of the evaporated refrigerant thanks to the groove. This is also because the condensed refrigerant can be conducted to the capillary channels 9 and 14 from the groove more easily, and the circulation of the condensed refrigerant is promoted.

Moreover, it is preferable that the upper plate 5 is a side of the upper plate 5, and possesses a recess part in the side of the internal space 7. It is also preferable that the upper plate 10 is a side of the upper plate 10, and possesses a recess part in the side of the internal space 12. This is because the recess part communicates with the vapor diffusion paths 8 and 13, and the capillary channels 9 and 14, and the diffusion of the evaporated refrigerant and the circulation of the condensed refrigerant in the thickness direction (vertical direction) are easily promoted.

Since the groove communicates with the vapor diffusion paths 8 and 13, the evaporated refrigerant easily touches the surfaces of the upper plates 5 and 10 in a large area. Thus, radiating the heat of the evaporated refrigerant is promoted.

For convenience, the upper plates 5 and 10 are called as "upper", however, the plates do not need to be a upside position physically, and do not need to be distinguished from the lower plates 6 and 10 specifically. Moreover, the upper plates 5 and 10 may touch the heating element 2, and may oppose to the heating element 2.

Moreover, upper plates 5 and 10 are provided with an injection port of the refrigerant. When the upper plates 5 and 10, the intermediate plates 18 and 19, and the lower plates 6 and 11 are laminated and connected, the internal spaces 7 and 12 will be formed. Since the internal spaces 7 and 12 need to seal the refrigerant, the refrigerant is entered from the injection port after connection of the upper plates 5 and 10 or the like. When the refrigerant is entered, the injection port is sealed. Then, the internal space is sealed.

In addition, the refrigerant may be entered from the injection port after the lamination, or may be entered when the upper plates 5 and 10, the lower plates 6 and 11, and the intermediate plates 18 and 19 are being laminated. Moreover, entering the refrigerant is preferably performed under a vacuum or decompression. By performing the entering under the vacuum or the decompression, the internal spaces 7 and 12 are under the vacuum or the decompression, and then the refrigerant is entered. Under the decompression, temperature of vaporization and condensation of the refrigerant becomes low, and there is a merit that repetition of the vaporization and condensation is promoted.

It is also preferable that the upper plates 5 and 10 are provided with a projection 40 and an adhesion part used for connecting to the intermediate plates 18 and 19 or the lower plates 6 and 11.

The lower plates 6 and 11 oppose to the upper plates 5 and 10, and sandwich one or a plurality of the intermediate plates 18 and 19 there-between. Although the lower plates 6 and 11 are formed of metal, resin, or the like, they are preferably formed of metal with high thermal conductivity, such as copper, aluminum, silver, aluminum alloy, iron, iron alloy, and stainless steel, or rust-free (high durability) metal. The lower plates 6 and 11 may be of one of various shapes, such as a rectangle, a lozenge, a circle, an ellipse, and a polygon. Since the thermal diffusing unit 3 and the heat transporting part 4 are formed opposing to the upper plates 5 and 10, it is preferable that the shape and the volume are the same as those of the upper plates 5 and 10.

It is preferable that the lower plate 6 is a side of the lower plate 6, and possesses a groove in the side of the internal space 7 being parallel to the first direction. It is also preferable that the lower plate 11 is a side of the upper plate 11, and possesses a groove in the side of the internal space 12 being parallel to the second direction. This is because it becomes easy to control the direction for the diffusion (transportation) of the evaporated refrigerant thanks to the groove. Moreover, this is because the condensed refrigerant can be conducted to the capillary channels 9 and 14 from the groove more easily, and the circulation of the condensed refrigerant is promoted. Alternatively, it is preferable that the lower plate 6 is a side of the lower plate 6, and possesses a recess part in the side of the internal space 7. It is also preferable that the lower plate 11 is a side of the lower plate 11, and possesses a recess part in the side of the internal space 12. This is because the recess part communicates with the vapor diffusion paths 8 and 13, and the capillary channels 9 and 14, and the diffusion of the evaporated refrigerant and the circulation of the condensed refrigerant in the thickness direction (vertical direction) are easily promoted.

Since the groove communicates with the vapor diffusion paths 8 and 13, the evaporated refrigerant easily touches the surfaces of the upper plates 5 and 10 in a large area. Thus, radiating the heat of the evaporated refrigerant is promoted.

In addition, the groove may be a recess part other than a slit-like groove. For convenience, the lower plates 6 and 11 are called as "lower", however, the plates do not need to be a lower position physically, and do not need to be distinguished from the upper plates 5 and 10 specifically.

It is also suitable for lower plates 6 and 11 to provided with a projection joined to the intermediate plates 18 and 19 and an adhesion part. It is also preferable that the lower plates 6 and 11 are provided with a projection and an adhesion part connecting to the intermediate plates 18 and 19. Moreover, the lower plates 6 and 11 may or may not touch the heating element 2.

The internal space 7 is formed by connecting the upper plate 5 and the lower plate 6. By surrounding the sides of the upper plate 5 and the lower plate 6 by the side walls 42, the internal space 7 to be sealed is formed. The side wall 42 is formed by connecting the substrate member and the projection which are laminated. This internal space 7 is formed in the thermal diffusing unit 3.

On the other hand, the internal space 12 is formed by connecting the upper plate 10 and the lower plate 11. Similar to the internal space 7, by surrounding the sides of the upper plate 10 and the lower plate 11 by side walls, the internal space 12 to be sealed is formed. The side wall is formed by connecting the substrate member and the projection which are laminated. This internal space 12 is formed in the heat transporting part 4.

Since surroundings of the internal spaces 7 and 12 are sealed, it is possible to enter the refrigerant therein. The injection port of the refrigerant is prepared in the part of the upper plates 5 and 10 or the lower plates 6 and 11. The refrigerant is entered in the internal spaces 7 and 12 from the injection port.

The internal space 7 provided in the thermal diffusing unit 3 comprises the vapor diffusion path 8 and the capillary channel 9 which are formed of the intermediate plate 18. By the vapor diffusion path 8 and the capillary channel 9, the heat is diffused in the first direction. Similarly, the internal space 12 provided in the heat transporting part 4 comprise the vapor diffusion path 13 and the capillary channel 14 which are formed of the intermediate plate 19. By the vapor diffusion path 13 and the capillary channel 14, the heat is diffused in the second direction.

Figure 6:
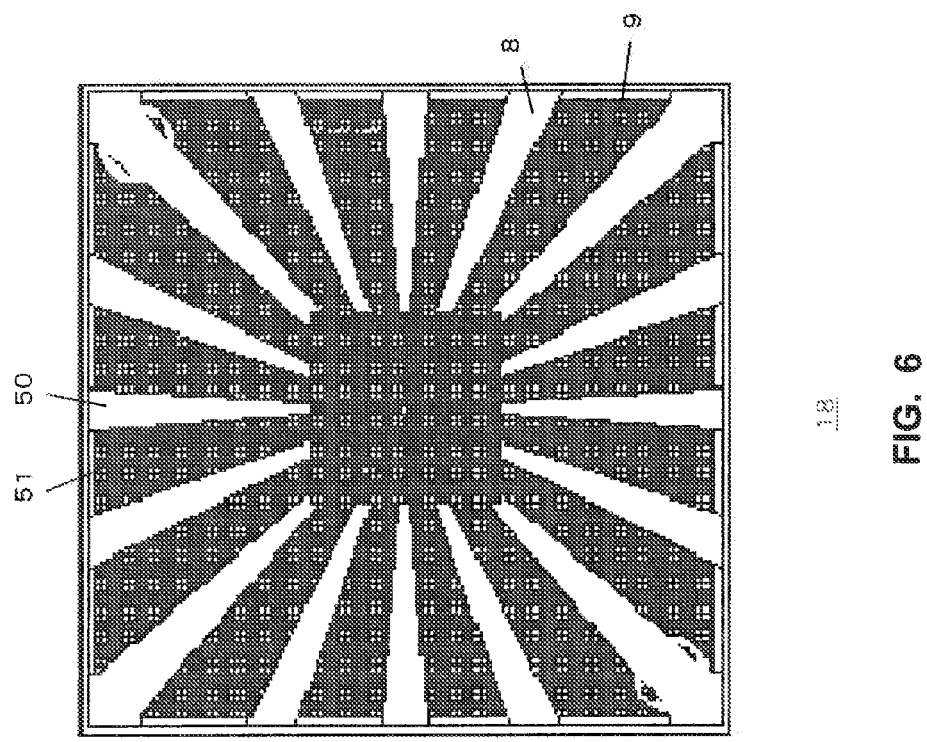
FIG. 6 is a front view of an intermediate plate comprised in a thermal diffusing unit of Embodiment 1 according to the Present Application.

Next, an internal structure of the thermal diffusing unit 3 will be explained using FIG. 6. FIG. 6 is a front view of the intermediate plate comprised in the thermal diffusing unit of Embodiment 1 according to the Present Application. By laminating the intermediate plate 18 (FIG. 6 is an example for this plate), the thermal diffusing unit forms the vapor diffusion path 8 and the capillary channel 9 between the upper plate 5 and the lower plate 6.

The intermediate plate 18 is composed of one or a plurality of substrates. In FIG. 5, the four intermediate plates 18 are laminated between the upper plate 5 and the lower plate 6. Although the intermediate plate 18 is formed of metal, resin, or the like, it is preferably formed of metal with high thermal conductivity, such as copper, aluminum, silver, aluminum alloy, iron, iron alloy, and stainless steel, or rust-free (high durability) metal. Moreover, the intermediate plate may be of one of various shapes, such as a rectangle, a lozenge, a circle, an ellipse, and a polygon. Since the thermal diffusing unit 3 is formed by sandwiching the upper plates 5 and 10, it is preferable that the shape is the same shape of the upper plates 5 and 10. The intermediate plate 18 may possess a projection and an adhesion part which are used when connecting the upper plate 5 and the lower plate 6.

Furthermore, the intermediate plate 18 possesses a notched part 50 and an internal through hole 51. This notched part 50 forms the vapor diffusion path 8. Since the intermediate plate 18 of FIG. 6 is provided with the notched part 50 being radial, the thermal diffusing unit 3 is provided with the vapor diffusion path 8 operable to diffuse the refrigerant, which is evaporated radially (Even it is radially, the vector, which is parallel to the first direction, is still included. In short, the first direction means that the direction spreads to a lateral direction of the heat transporting part 4). By the vapor diffusion path 8 being radial, the thermal diffusing unit 3 can diffuse the heat radially.

The internal through hole 51 forms the capillary channel 9. When the thermal diffusing unit 3 is provided with one intermediate plate 18, the internal through hole 51 in one intermediate plate 18 forms the capillary channel 9 as it is.

On the contrary, when the thermal diffusing unit 3 is provided with a plurality of the intermediate plates 18, the internal through holes 51 respectively provided in each of the plurality of intermediate plates 18 overlaps only partially, and the capillary channel 9 possessing a cross-section area smaller than that of the internal through hole 51 in the direction of the plane is formed. Thus, when the thermal diffusing unit 3 is provided with the plurality of the intermediate plates 18, the capillary channel 9 possessing a cross-section area smaller than that of the internal through hole 51. Therefore, the condensed refrigerant can circulate with higher efficiency. This is because movement of the liquid by capillarity is promoted because the cross-section area of the capillary tube is small.

In addition, it is suitable that each of the intermediate plate 18 is provided with a plurality of internal through holes 51. This is because the plurality of the internal through holes 51 can form the capillary channel 9 possessing a plurality of channels.

The plurality of internal through holes 51 penetrate the intermediate plates 18 from the front faces to the rear faces, and the shapes thereof may be circles, ellipses, or rectangles. Alternatively, it may be a slit-like shape.

The internal through hole 51 may be formed according to boring, pressing, wet etching, dry etching, or the like.

When the thermal diffusing unit 3 is provided with the plurality of the intermediate plates 18, the internal through holes 51 are formed in each of the plurality of the intermediate plates 18. The plurality of intermediate plates 18 are laminated so that a part of the internal through holes 51 overlaps, respectively. The internal through holes 51 of every intermediate plate 18 preferably shift from those of an intermediate plate adjacent thereto, respectively. For example, internal through holes 51 of a certain intermediate plate 18 shift from internal through holes 51 of another intermediate plate 18 adjacent thereto such that a part of the internal through holes 51 partially overlap. Thus, by shifting internal through holes 51 for every adjacent intermediate plate 18, when the plurality of intermediate plates 18 are laminated, the capillary channel 9 possessing a cross-section area smaller than that of the internal through hole 51 in the direction of the plane is formed.

When the plurality of intermediate plates 18 is laminated, parts of the internal through holes 51 partially overlap and possess a cross-section area smaller than that of the internal through hole 51 in the direction of the plane. Holes having a cross-section area smaller than that of the internal through hole 51 are laminated in the vertical direction of the thermal diffusing unit 3, the holes are connected in the vertical direction, thereby forming flow paths in the vertical direction. The holes are stairs-like in the vertical direction, the flow paths brings flow not only in the vertical direction but also in the horizontal direction. As a result, the flow paths formed in the vertical and horizontal directions cause the condensed refrigerant to circulate in the vertical direction or in the vertical and horizontal directions. In addition, since the capillary channel 9 communicates with the recess part provided with the upper plate 5 or the lower plate 6, the refrigerant, which is refrigerated and condensed in the recess part, is conducted to the capillary channel 9 from the recess part, and circulates through the capillary channel 9. Thus, since the recess part and the capillary channel 9 communicate with each other, the circulation of the condensed refrigerant is promoted.

When causing only a part of internal through holes 51 to overlap, thereby forming holes having a cross-section area smaller than that of the internal through hole 51, there is a merit that the capillary channel 9 can be manufactured easily rather than when directly manufacturing it.

In addition, the capillary channel 24 causes the condensed refrigerant to circulate, and the vaporized refrigerant may pass therein.

Angle portion of the capillary channel 9, the recess part, or the notched part 41 may be preferably beveled or rounded. The section of the capillary channel 9 may be of one of various shapes, such as a hexagon, a circle, an ellipse, a rectangle, and a polygon. The cross-sectional shape of the capillary channel 9 is determined by how the shape of the internal through hole 51 and the internal through hole 51 are piled up.

In addition, although the internal structure of the thermal diffusing unit 3 possessing the structure of diffusing the heat radially in FIG. 6 is explained, the internal structure of the thermal diffusing unit 3 may be a structure for diffusing the heat linearly in the first direction. The thermal diffusing unit 3 of the structure diffusing the heat linearly will be explained simultaneously when the internal structure of the heat transporting part is explained.

Figure 7:
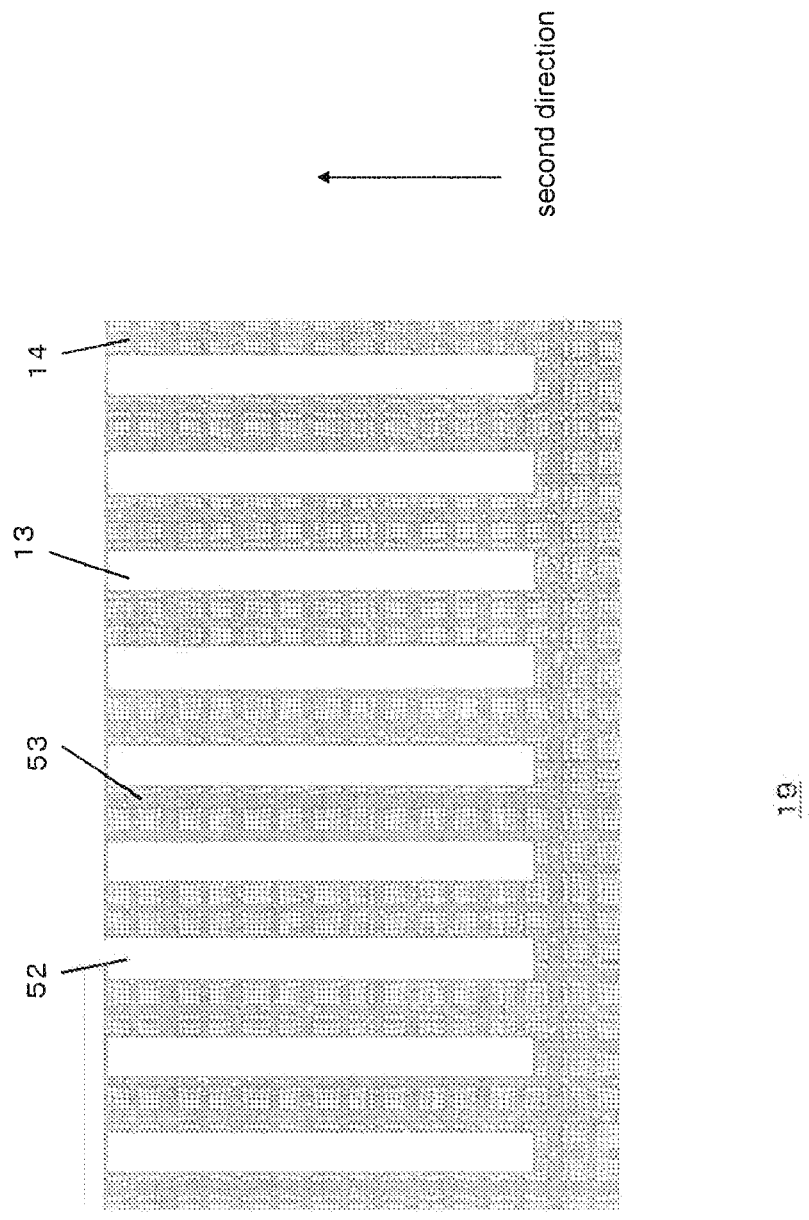
FIG. 7 is a front view of the intermediate plate provided in a heat transporting part 4 of Embodiment 1 according to the Present Application.
Figure 8:
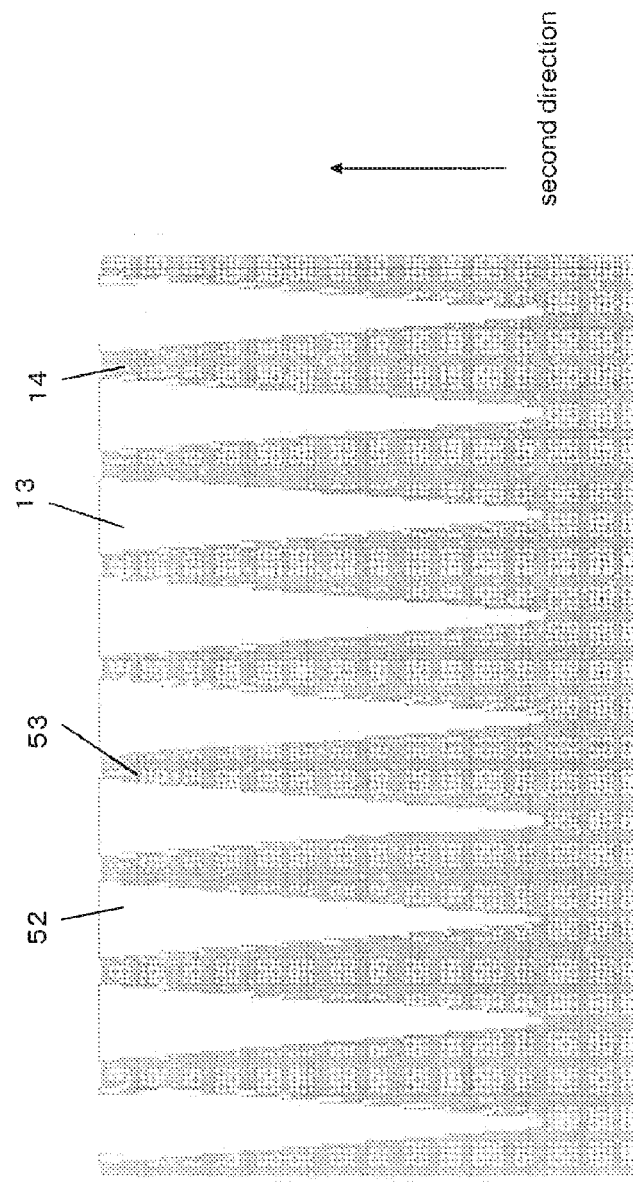
FIG. 8 is a front view of the intermediate plate provided in the heat transporting part 4 of Embodiment 1 according to the Present Application.

FIG. 7 and FIG. 8 are front views of the intermediate plate 5 provided in the heat transporting part 4 of Embodiment 1 according to the Present Application. The intermediate plate 19 may possess a material, a shape, and a structure, which are similar to the intermediate plate 18 utilized for the thermal diffusing unit 3.

As shown in FIG. 7 and FIG. 8, the heat transporting part 4 is provided with the vapor diffusion path 13 being linear in a certain direction (second direction), and the capillary channel 14.

The intermediate plate 19 shown in FIG. 7 is provided with a notched part 52 possessing a substantially equal width in the second direction. A plurality of the notched parts 52 is provided, and some of substrate member remains between the notched parts. The internal through hole 53 is formed in the remaining member. According to the structure, the vapor diffusion path 13 and the capillary channel 14, which are parallel to the second direction are formed. The heat transporting part 4, which is provided with the intermediate plate 19 shown in FIG. 7, can diffuse the evaporated refrigerant from an end part to the other side of the end part (alternatively from near the center to the both end parts). Moreover, since the capillary channel 14 is formed to be parallel to the vapor diffusion path 13, the condensed refrigerant can circulate in the second direction more easily.

According to the shape of such a notched part 52, the heat transporting part 4 can diffuse the evaporated refrigerant from an end part to the other side of end part. As a result, the heat transporting part 4 can transport the heat in the second direction. Moreover, the internal through hole 53 is provided at the area where the member of the intermediate plate 19 remains other than the notched part 52, and the internal through hole 53 forms the capillary channel 14. Since the capillary channel 14 is formed to be parallel to the vapor diffusion path 13, similar to the vapor diffusion path 13, the capillary channel 14 causes the condensed refrigerant to circulate from an end part to the other side of end part. For this reason, since the diffusion of the evaporated refrigerant and the circulation of the condensed refrigerant from an end part to the other side of end part (in the second direction) are performed, the heat transporting in the second direction can be performed with high efficiency.

Moreover, since the plurality of the vapor diffusion paths 13 and the plurality of the capillary channels 14 are arranged one after another, the heat transporting part 4 shown in FIG. 7 can improve the efficiency of the diffusion of the evaporated refrigerant and the circulation of the condensed refrigerant.

Similar to FIG. 7, FIG. 8 shows the intermediate plate 19 operable to transport the heat in the second direction. The intermediate plate 19 of FIG. 8 is provided with the notched part 52 which spreads from an end part to the other end part in the second direction. That is, in the second direction, width of an end part of the notched part 52 is narrower than width of the other end part of the notched part 52. According to the shape of the notched part 52, the heat transporting part 4 can possess the vapor diffusion path 13, which can easily diffuse the evaporated refrigerant from an end part to the other side of end part. Since the internal through hole 53 is formed in the area where the remaining member other than the notched part 52, the capillary channel 14 is formed with the shape of line symmetry comparing to the vapor diffusion path 13 spreading downwards. The capillary channel 14 can cause the condensed refrigerant to easily circulate in the second direction.

Moreover, comparing to a case where the vapor diffusion path 13 possessing the substantially equal width shown in FIG. 7, since the vapor diffusion path 13 spreading downwards can secure the diffusion area of the refrigerant with the increased volume after vaporization, it is possible to promote the speed of the thermal diffusion. Thus, when the heat should be transported from an end part to the other side of end part, the heat transporting part 4 shown in FIG. 4 is suitable.

In the heat transporting part 4 shown in FIG. 7 and FIG. 8, although the vapor diffusion path 13 and the capillary channel 14 are formed from an end part to the other side of the end part, the vapor diffusion path 13 and the capillary channel 14 may be formed from midway (for example, at a substantial center) to the both end parts of the heat transporting part 4. Alternatively, connecting two members shown in FIG. 7 and FIG. 8, thereby the heat transporting part 4 operable to transport the heat from the substantial center to the both end parts (the heat transporting in the second direction is performed also in this case) may be formed.

In addition, the explanation of the capillary channel 14 of the heat transporting part 4 is the same as the explanation of the capillary channel 9 of the thermal diffusing unit 3. That is, the heat transporting part 4 is formed by the internal through hole 53 which is formed by digging out a single intermediate plate 19, or is formed by overlapping the parts of the internal through holes 53, which is formed by digging out a plurality of the intermediate plates 19. Such a capillary channel 14 circulates the condensed refrigerant in the horizontal direction and the thickness direction. Moreover, the recess part, which is provided inside of at least one of the upper plate 10 or the lower plate 11, communicates with the capillary channel 14 or the vapor diffusion path 13. The communication improves the diffusion of the evaporated refrigerant and the circulation of the condensed refrigerant. Thus, it is possible to realize the diffusion of the evaporated refrigerant and the circulation of the condensed refrigerant in the horizontal direction and the thickness direction.

In addition, although the intermediated plate 19, which is used by the heat transporting part 4, is explained in FIG. 7 and FIG. 8, the shape shown in FIG. 7 and FIG. 8 may be used as the intermediate plate 18 of the thermal diffusing unit 3. When the vapor diffusion path 8 and capillary channel 9 with the substantially equal width and a shape spreading to the end in the first direction is formed, the thermal diffusing unit 3 can diffuse the heat in the first direction. At this time, by combining the two intermediate plates shown in FIG. 7 and FIG. 8, the thermal diffusing unit 3 may possess a structure for diffusing the heat from the center part to the both end parts (in the first direction).

As mentioned above, since the vapor diffusion path and the capillary channel with the substantially equal width or the shape spreading to the end from an end part to the other side of end part are provided, the thermal diffusing unit 3 and the heat transporting part 4 can diffuse and transport the heat in the first direction or the second direction.

In addition, when each of the upper plate, the lower plate, and the intermediate plate, which is used in the thermal diffusing unit 3 and the heat transporting part 4, possesses the plate-like shape, the thermal diffusing unit 3 and the heat transporting part 4 to be formed possess the plate-like shape. When each of the upper plate, the lower plate, and the intermediate plate possesses the curved shape, the thermal diffusing unit 3 and the heat transporting part 4 possess the curved shape.

Moreover, the technology and structure, which are the same as those of the thermal diffusing unit 3, are used in the heat transporting part 4.

By laminating and connecting the upper plate, the lower plate, and the intermediate plate, the thermal diffusing unit 3 and the heat transporting part 4 are manufactured. The upper plate, the lower plate, and the plurality of intermediate plates are set to the predetermined position, respectively. In addition, the plurality of intermediate plates is set such that only a part of internal through holes respectively provided therein overlap.

At least one of the upper plate, the lower plate, and the plurality of the intermediate plates possess the projection to be connected. The upper plate, the lower plate and the plurality of intermediate plates are arranged with respect to their positions and are directly joined by heat press to be unified. At this time, each part material is directly joined with the projection to be connected. At this time, the cooling device 1 can be manufactured at few processes by laminating and connecting the member forming the thermal diffusing unit 3 and the member forming the heat transporting part all at once.

The directly joining means to cause faces of two members to adhere with other and press them, thereby adding heat treatment to them. Due to this, atoms of the faces are firmly connected according to atomic force acting between the faces, and the faces of the two members can be unified without using adhesives. Herein, the directly joining realizes solid connection. That is, since the thermal bonding is realized by crushing the projection to be connected and increasing the area in contact with, the projection to be connected plays an important role in the connecting. As for a condition for the direct joining in the heat press, pressure is preferably of 40 [kg/cm2] to 150 [kg/cm2], and temperature is preferably of 250 to 400 [degrees Centigrade].

The refrigerant is entered via an inlet port opened at a part of the upper plate or the lower plate. The inlet port is closed, and then manufacturing the thermal diffusing unit 3 and the heat transporting part 4 is completed. Entering the refrigerant is performed under a vacuum or decompression. By performing the entering under the vacuum or the decompression, the internal space of the thermal diffusing unit 3 or the heat transporting part 4 is under the vacuum or the decompression, and then the refrigerant is sealed. Under the decompression, temperature of vaporization and condensation of the refrigerant becomes low, and there is a merit that repetition of the vaporization and condensation is promoted.

As mentioned above, in the cooling device of Embodiment 1, the thermal diffusing unit 3 diffuses the heat taken from the heating element 2, and conducts the heat to the heat transporting part 4. The heat transporting part 4 transports the received heat to the area for radiating the heat. Furthermore, since the end part of the heat transporting part 4 possesses a structure of a shape letting the radiating easily, and thermally touches to an element (such as a heat radiating substrate, a fin, and a heat sink) operable to radiate the heat, the heat transported by the heat transporting part 4 can be diffused. By diffusing the heat, the heating element 2 can be refrigerated. Even when the position of the heating element 2 and the part operable to diffuse the heat are separated, the cooling device 1 can refrigerate the heating element 2.

By possessing such a structure, even when the heating element is compact, it is possible to refrigerate with high efficiency by utilizing the entire of the cooling device.

Figure 9:
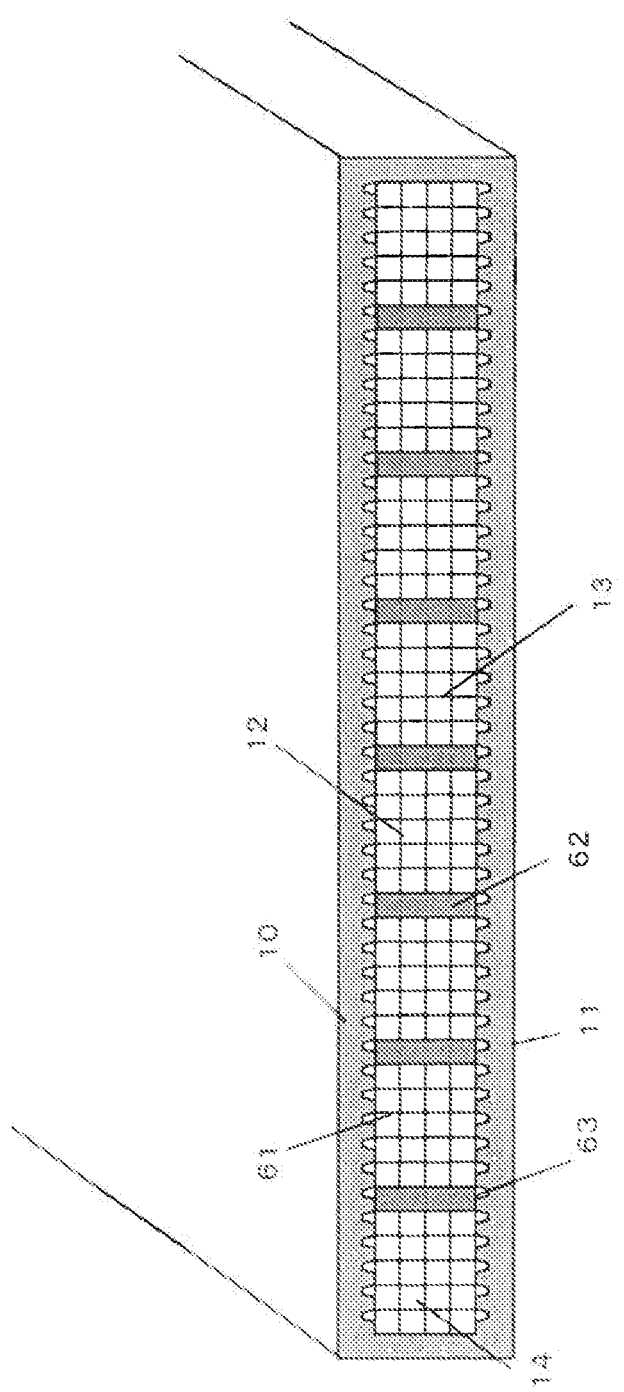
FIG. 9 is a perspective view of a heat transporting part of Embodiment 2 according to the Present Application.

A cooling device according to Embodiment 2 is provided with a heat transporting part, an internal space of which is divided into a plurality of paths. FIG. 9 is a perspective view of the heat transporting part of Embodiment 2 according to the Present Application. In order to see the inside of a heat transporting part 60 easier, the end part of the heat transporting part 60 is opened.

The heat transporting part 60 possesses the internal space 12 formed by connecting the upper plate 10 and the lower plate 11, and is provided with a plurality of paths 61 that divides the internal space 12 in the second direction. The plurality of paths 61 is parallel to the second direction. When the heat transporting part 60 possesses the plate-like shape possessing the lateral direction and the longitudinal direction, the second direction is the longitudinal direction.

The plurality of paths 61 is formed by a border 62, which connects the upper plate 10 and the lower plate 11 in the internal space 12. At this time, since the number of the border 62 is of plurality, the number of the path 61 to be formed increases.

Although the internal space 12 is formed by connecting the upper plate 10 and the lower plate 11, by providing with a projection to be connected at the position to be the border 62 at this time, the border 62 is formed at the time when the upper plate 10 and the lower plate are being connected. The path 61 is formed by the border 62.

By dividing the internal space 12 into the plurality of the paths 61, the heat conducted from the thermal diffusing unit 3 is transported to every path 61. The thermal diffusing unit 3 diffuses the heat taken from the heating element in the first direction (for example, radially). The heat diffused by the thermal diffusing unit 3 is conducted to the heat transporting part 4 through the upper plate 5 of the thermal diffusing unit 3. At this time, the heat from the thermal diffusing unit 3 is gradually conducted to the heat transporting part 4 in the middle of diffusion. For this reason, the heat from the thermal diffusing unit 3 is conducted to the heat transporting part 4 at various places in the lateral direction of the heat transporting part 4.

When the internal space 12 of the heat transporting part 4 is a single space like Embodiment 1, the heat transporting part transports the heat conducted at various places in the lateral direction of the heat transporting part 4 by using the vapor diffusion path 13. Since the heat is transported by the entire of the internal space 12, the burden in heat transporting increases. Thus, it may cause the efficiency of the heat transporting to decrease.

On the other hand, since the heat transporting part 60 shown in FIG. 9 possesses the plurality of the paths 61 that divide the internal space 12 in the lateral direction, the heat transporting is performed for every path 61. For this reason, since the burden of heat transporting is divided into every path 61, the burden of heat transporting is decreased in the entire heat transporting part 4. For example, when the heat from the thermal diffusing unit 3 is conducted at each position in the lateral direction of the heat transporting part 60, the heat received by each of the plurality of paths 61 is transported. Among the plurality of the paths 61, the path 61 near the center transports the heat conducted near the center. Among the plurality of the paths 61, the path near the end part transports the heat conducted near the end part. For this reason, the heat transporting part 60 can transport the heat with high efficiency.

Alternatively, the heat from the thermal diffusing unit 3 may not be conducted evenly in the lateral direction of the heat transporting part 60. In other words, the heat from the thermal diffusing unit 3 may be conducted unevenly for every position. For example, the heat may not be conducted to near the center in the lateral direction of the heat transporting part 60, and may be conducted to near the end part in the lateral direction. Since the heat transporting part 60 transports the heat according to the evaporation and circulation of the refrigerant sealed in the internal space 12, if the internal space 12 is the single space not divided by the path 61, the refrigerant near the center part is not utilized. Thus, the diffusion area varies in the longitudinal direction. Consequently, the heat transporting part 60 cannot transport the heat with high efficiency.

On the contrary, when the internal space 12 is divided by the plurality of paths 61 as shown in FIG. 9, the path 61 at the position where heat is conducted may transport the heat according to the vaporization and condensation of the refrigerant. For this reason, since the volume used for heat transporting is small, and there is no variation in the longitudinal direction, the heat transporting part 60 can transport the heat with high efficiency.

Since the heat transporting part 60 transports the heat in the second direction, it is suitable that the plurality of paths 61 is provided with a groove 63, which is parallel to the second direction, in the inner wall. Since the groove 63 being parallel to the second direction is provided, the diffusion of the evaporated refrigerant and the circulation of the condensed refrigerant in the path 61 may be performed in the second direction more easily. For this reason, the heat transporting part 60 can transport the heat with high efficiency in the second direction.

Moreover, a communicating path that enables the refrigerant to move between the paths 61 may be provided. Although the refrigerant is sealed in every path 61, since the necessary amount of refrigerant changes according to the amount of heat to be transported, it is possible to exchange the necessary amount of refrigerant for every path 61 via the communicating path.

Figure 10:
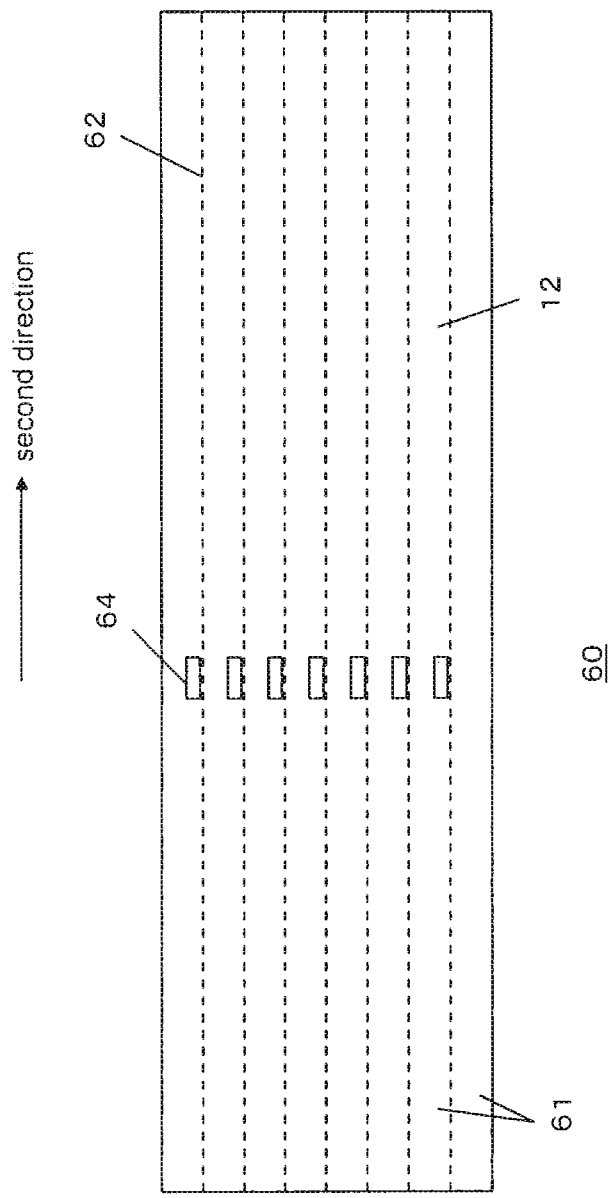
FIG. 10 is a mimetic diagram of the heat transporting part in Embodiment 2 according to the Present Application.

FIG. 10 is a mimetic diagram of a heat transporting part in Embodiment 2 according to the Present Application. The heat transporting part 60, an internal space 12 of which is divided by the plurality of paths 61, is provided with a communicating path 64 enabling the refrigerant to penetrate and move among the plurality of paths 62.

For example, when the heat from the thermal diffusing unit 3 is hardly conducted near the center of the lateral direction of the heat transporting part 60 but is well conducted near the end part of the lateral direction, the path 61 located near the end part requires a large amount of refrigerant for the heat transporting, and the path 61 near the center does not require such a refrigerant.

In this case, the refrigerant can move from the path 61 near the center part to the path 61 near the end part through the communicating path 64. The path 61 near the end part requiring the large amount of refrigerant performs the heat transporting by using a refrigerant given via the other paths 61.

In addition, each of the plurality of paths 61 is provided with the intermediate plate arranged and laminated between the upper plate 10 and the lower plate 11. Since the intermediate plate possesses the notched part and the internal through hole, the vapor diffusion path and the capillary channel are provided with each of the plurality of paths 61. Since the vapor diffusion path and the capillary channel are provided with each of the plurality of paths 61, the evaporated refrigerant is diffused in the vapor diffusion path, and the condensed refrigerant is circulated in the capillary channel. The path 61 transports the heat according to the diffusion and circulation of the refrigerant.

In addition, the number of the paths 61 in the heat transporting part 60 can be arbitrary, and may be determined considering ease and durability when manufacturing thereof. For example, the width and the number of the paths 61 may be determined considering the position contacting with the thermal diffusing unit 3. Furthermore, the border 62 forming the path 61 can also realize securing the strength of the heat transporting part 60.

Moreover, since it is enough to provide with the groove 63 only the inside of the path 61, the groove 63 may be arranged at the upper plate 10, the lower plate 11, or the border 62. When the groove 63 is arranged at the border 62 or the side wall, by shaving the end faces of the plurality of laminated substrate members, the groove 63 may be formed as it is when each of the plurality of substrate members are laminated.

Thus, the cooling device according to Embodiment 2 can transport with high efficiency the heat conducted by the thermal diffusing unit 3 with the heat transporting part 60.

Figure 11:
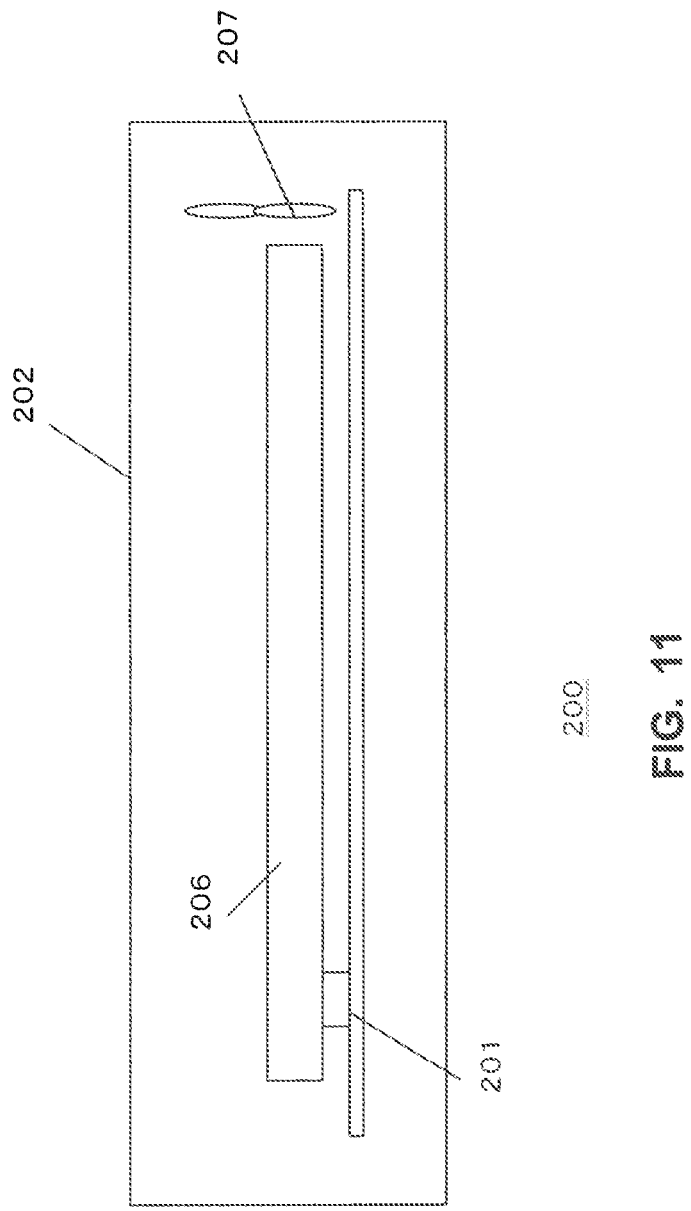
FIG. 11 is an interior figure of an electric device in Embodiment 3 according to the Present Application.

In Embodiment 3, a device (or a system) including a heat radiating unit operable to radiate the heat transported by the heat transporting parts 4 and 60, and an electronic device provided with the cooling device will be explained. Referring to FIG. 11, an electronic device 200 possesses a substrate that an electronic component 201 is mounted thereon, and a case 202. Moreover, a cooling device 206 is mounted for thermally contacting with the electronic component 201. In addition, this cooling device 206 possesses one of the structures of the cooling devices explained in Embodiments 1 and 2.

A cooling fan 203 is provided at the end part of the cooling device 206. The electronic component 201 is arranged at the end part of the cooling device 206. That is, the cooling device 206 is provided with a thermal diffusing unit at the end part, and a heat transporting unit, which is laminated with the thermal diffusing unit in a thickness direction. The heat transporting part transports the heat from an end part to the other side of end part. The heat transporting part is a plate-like shaped member possessing a lateral direction and a longitudinal direction. The thermal diffusing unit diffuses the heat in the lateral direction of the heat transporting part, and conducts the heat to the heat transporting part.

The heat transporting part transports the heat conducted by the thermal diffusing unit to the end part, which is an opposite arrangement position of the electronic component 201. The cooling fan 207 refrigerates the transported heat by the transported heat by blow. At this time, the electronic component 201 is a compact light emitting element, such as an LED. The thermal diffusing unit diffuses the heat taken from the electronic component 201 in a manner such that the taken heat extends in the lateral direction (the first direction) of the heat transporting part. The thermal diffusing unit conducts the diffused heat to the heat transporting part. At this time, by forming an upper plate of the thermal diffusing unit and a lower plate of the heat transporting part with the same member, the thermal diffusing unit can transport the heat to the heat transporting part with high efficiency.

The heat transporting transports the heat conducted by the thermal diffusing unit to an end part of the side of the cooling fan 207 being the end part. The cooling fan 207 refrigerates the heat transported by the heat transporting part. By refrigerating, the evaporated refrigerant that has moved in the heat transporting part is condensed and circulated. By repetition of the condensation and circulation, the heat transporting part can transport the heat from the thermal diffusing unit again.

Similarly, since the thermal diffusing unit conducts the diffused heat to the heat transporting part, the evaporated refrigerant is condensed and circulated. Consequently, the heat is taken from the heating element again, and then is diffused in the first direction.

Thus, since the electric device that the cooling device 206 has been mounted thereon can refrigerate the electronic component 201 of the heating element, it is possible to prevent from excessive heat generation of the electronic component 201, or troubles caused by the excessive heat generation.

Figure 12:
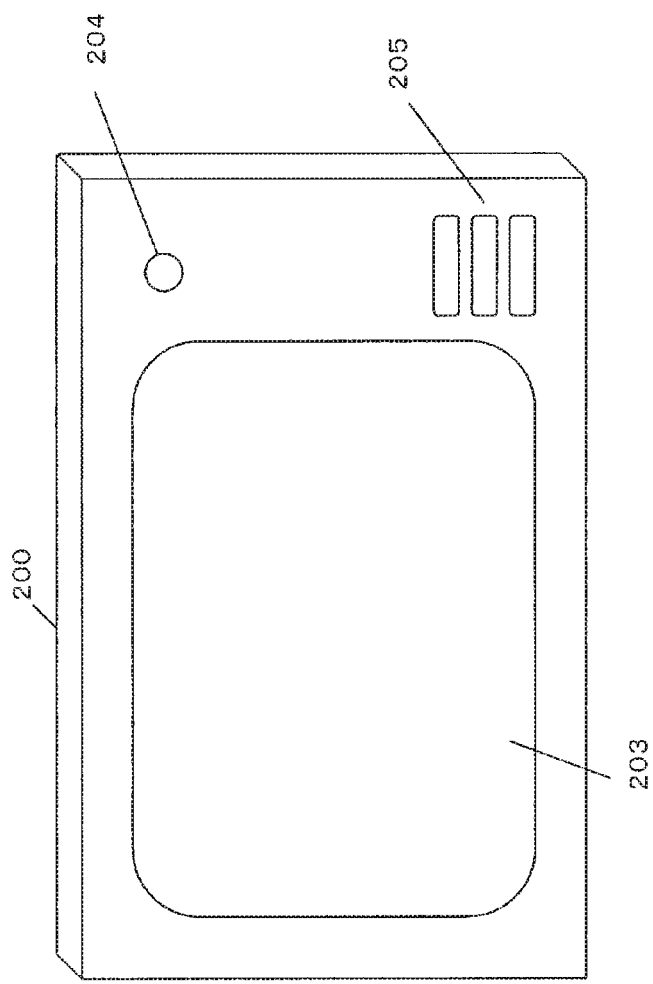
FIG. 12 is a perspective diagram of the electric device in Embodiment 3 according to the Present Application.

An example of the electronic device is shown in FIG. 12. FIG. 12 is a perspective diagram of the electric device in Embodiment 3 according to the Present Application. The electronic device 200 is an electric device, such as a car television set, and a personal monitor, required to be thin and small.

The electronic device 200 is provided with a display 203, a light-emitting element 204, and a speaker 205. The cooling device 206 is stored in the internal of this electronic device 200, thereby realizing refrigerating a heating element.

When such a cooling device 206 is used, the heating element can be refrigerated without obstructing reducing the size and the thickness of the electronic device. That is, the cooling device 206 transports the heat from the heating element at high speed, refrigerates, and suppresses heat generation of the heating element.

Considering in this way, it is possible to suitably replace a heat radiating fin, a liquid-cooled device, or the like having been mounted on a notebook personal computer, a portable terminal, a computer terminal, or the like, with the cooling device 206. It is also possible replace a heat radiating frame, a cooling device, or the like having been mounted on a light, an engine, or a control computer unit of an automobile or an industrial apparatus, with the cooling device 206. Since the cooling device 206 possesses a cooling ability which is higher than those of a heat radiating fin or a heat radiating frame used conventionally, it can be miniaturized naturally. Furthermore, the cooling device 206 can flexibly deal with a heating element, and various electronic components can be selected as a cooling target thereof. As a result, the cooling device 206 possesses broad applicability.

As mentioned above, the cooling device and the electronic device in Embodiments 1 to 3 are mere examples explaining aspects according to the Present Application. Of course, modification, reconstruction, or the like thereof not departing from the aspects are included in the Present Application. Moreover, the cooling device may be a plate-like shape, curved, or a solid-like shape with thickness. Shapes and appearances are not especially limited.

While a preferred embodiment of the Present Application is shown and described, it is envisioned that those skilled in the art may devise various modifications without departing from the spirit and scope of the foregoing Description and the appended Claims.

What is claimed is:

1. A cooling device, the cooling device comprising:
    a thermal diffusion unit, the thermal diffusion unit having a mounting surface for mounting to a heating element, the thermal diffusion unit configured to diffuse heat from the heating element; and
    a heat transporting unit, the heat transporting unit being laminated in a thickness direction of the thermal diffusion unit and operable to transport the heat diffused by the thermal diffusion unit;
    wherein:
    the thermal diffusion unit comprises:
    a first upper plate;
    a first lower plate spaced apart from and opposing the first upper plate;
    a first internal space formed by laminating the first upper plate and the first lower plate together, a first refrigerant disposed therein, the first refrigerant being sealed in the first internal space;
    a first vapor diffusion path formed in the first internal space, the first refrigerant being vaporized and diffused therein; the first vapor diffusion path extending in a first direction; and
    a first capillary channel formed in the first internal space, the first refrigerant being condensed and circulated therein;
    the heat transporting unit comprises:
    a second upper plate;
    a second lower plate spaced apart from and opposing the second upper plate; a second internal space formed by laminating the second upper plate and the second lower plate, a second refrigerant disposed therein, the second refrigerant being sealed into the second internal space;
    a second vapor diffusion path formed in the second internal space, the second refrigerant being vaporized and diffused therein; the second vapor diffusion path extending in a second direction that is different than the first direction; and
    a second capillary channel formed in the second internal space, the second refrigerant being condensed and circulated therein; and
    the thermal diffusion unit and the heat transporting unit being disposed adjacent each other and on opposite sides of a common member that separates the first and second internal spaces from each other, and wherein the first upper plate of the thermal diffusion unit and the second lower plate of the heat transporting unit are the same member and define the common member.

2. The cooling device of claim 1, wherein thermal diffusion unit diffuses the heat taken from the heating element in the first direction.

3. The cooling device of claim 1, wherein the first and second directions cross with each other.

4. The cooling device of claim 2, wherein the heat transporting unit transports the heat diffused by the thermal diffusion unit in the second direction.

5. The cooling device of claim 4, wherein the first and second directions are substantially perpendicular to each other.

6. The cooling device of claim 5, wherein said heat transporting part is formed of a plate-like shape possessing a longitudinal direction and a lateral direction.

7. The cooling device of claim 6, wherein:
    said heat diffusing unit is laminated in an area overlapping a part area of said heat transporting part; and
    the first direction is parallel to the lateral direction: and
    the second direction is parallel to the longitudinal direction.

8. The cooling device of claim 7, wherein the heat transporting unit further comprises a plurality of paths dividing the internal space along the longitudinal direction.

9. The cooling device of claim 8, wherein each path comprises a groove formed on an inner wall of said plurality of paths along the longitudinal direction.

10. The cooling device of claim 9, wherein each path further comprises a communicating path penetrating from one of the paths to another of the paths, the second refrigerant being able to move through said communicating path.

11. The cooling device of claim 1, wherein said thermal diffusion unit radially diffuses the heat.

12. The cooling device of claim 1, wherein the thermal diffusion unit is laminated in a direction of thickness in an area of either an end of said heat transporting part or a substantial center part of said heat transporting unit.

13. The cooling device of claim 12, wherein the heat transporting part transports the heat from the end where the thermal diffusion unit has been laminated to another end thereof when said heat diffusion unit has been laminated at the end.

14. The cooling device of claim 13, wherein the heat transporting unit transports the heat from the substantial center part to the end and the other end when the heat diffusion unit has been laminated at the substantial center part of said heat transporting unit.

15. The cooling device of claim 1, wherein the heat transporting part further comprises a heat radiating unit provided with at least one end of the longitudinal direction and the lateral direction for radiating transported heat.

16. The cooling device of claim 1, wherein at least one of the first and second upper plates and first and second lower plates further comprises a recess part communicating with at least one of said first and second vapor diffusion paths and said first and second capillary channels.

17. The cooling device of claim 1, wherein the first and second vapor diffusion paths diffuse the first and second refrigerants, respectively, in at least one of a thickness direction and a horizontal direction.

18. The cooling device of claim 17, wherein the first and second capillary channels cause the first and second refrigerants, respectively, to circulate in at least one of a vertical direction and vertical and horizontal directions.

* * * * *